US012660161B2

(12) United States Patent
Cho

(10) Patent No.: US 12,660,161 B2
(45) Date of Patent: Jun. 16, 2026

(54) CAPACITOR STRUCTURE AND METHOD FOR MANUFACTURING SAME, SEMICONDUCTOR STRUCTURE AND METHOD FOR MANUFACTURING SAME

(71) Applicants:CHANGXIN MEMORY TECHNOLOGIES, INC., Hefei City (CN); CHANGXIN JIDIAN (BEIJING) MEMORY TECHNOLOGIES CO., LTD., Beijing (CN)

(72) Inventor: Gyuseog Cho, Hefei (CN)

(73) Assignees: CHANGXIN MEMORY TECHNOLOGIES, INC., Hefei City (CN); CHANGXIN JIDIAN (BEIJING) MEMORY TECHNOLOGIES CO., LTD., Beijing (CN)

( * ) Notice: Subject to any disclaimer, the term of this patent is extended or adjusted under 35 U.S.C. 154(b) by 409 days.

(21) Appl. No.: 18/318,152

(22) Filed: May 16, 2023

(65) Prior Publication Data

US 2023/0363144 A1      Nov. 9, 2023

Related U.S. Application Data

(63) Continuation of application No. PCT/CN2022/105189, filed on Jul. 12, 2022.

(30) Foreign Application Priority Data

May 6, 2022      (CN) .......................... 202210484668.2

(51) Int. Cl.
*H10B 12/00*                (2023.01)

(52) U.S. Cl.
CPC ......... *H10B 12/315* (2023.02); *H10B 12/033* (2023.02)

(58) Field of Classification Search
CPC .............................. H10B 12/03; H10B 12/315
See application file for complete search history.

(56) References Cited

U.S. PATENT DOCUMENTS 5,383,152 A      1/1995  Miyake
5,986,300 A      11/1999  Tanaka
(Continued)

FOREIGN PATENT DOCUMENTS

CN          108933136 A      12/2018
CN          112071841 A      12/2020
(Continued)

OTHER PUBLICATIONS

International Search Report in the international application No. PCT/CN2022/105189, mailed on Jan. 16, 2023, 3 pages.
(Continued)

*Primary Examiner* — Brent A. Fairbanks
*Assistant Examiner* — Molly K Reida
(74) *Attorney, Agent, or Firm* — Syncoda LLC; Feng Ma

(57) ABSTRACT

A capacitor structure includes a substrate and a first electrode, a first dielectric layer and a second electrode arranged on the substrate, in which the first electrode includes at least two sub-electrodes continuously arranged in a direction perpendicular to the substrate and connected in sequence, of the at least two sub-electrodes, an orthographic projection of at least one of the sub-electrodes on the substrate covers an orthographic projection of another of the sub-electrodes on the substrate; the first dielectric layer is arranged on at least part of an outer surface of the first electrode; the second
(Continued)

11

21 electrode is arranged on at least part of an outer surface of the first dielectric layer, and the second electrode is insulated from the first electrode.

11 Claims, 37 Drawing Sheets

(56) References Cited

U.S. PATENT DOCUMENTS

| | | | |
|---|---|---|---|
| 6,146,942 | A | 11/2000 | Tanaka |
| 7,452,783 | B2 | 11/2008 | Cho |
| 7,719,045 | B2 | 5/2010 | Cho |
| 7,919,803 | B2 | 4/2011 | Yokoi |
| 2006/0113580 | A1 | 6/2006 | Cho |
| 2009/0039404 | A1 | 2/2009 | Cho |
| 2009/0078981 | A1 | 3/2009 | Yokoi |
| 2021/0391414 | A1* | 12/2021 | Xia ......................... H10D 1/714 |

FOREIGN PATENT DOCUMENTS

| | | | | |
|---|---|---|---|---|
| CN | 112736136 | A | 4/2021 | |
| CN | 113809080 | A * | 12/2021 | ............. H10D 1/692 |
| CN | 114078773 | A | 2/2022 | |
| CN | 114582873 | A | 6/2022 | |
| JP | H06204427 | A | 7/1994 | |
| JP | 2000077626 | A | 3/2000 | |
| JP | 2011003598 | A | 1/2011 | |
| JP | 2014045003 | A | 3/2014 | |
| TW | 201123359 | A | 7/2011 | |

OTHER PUBLICATIONS

First Office Action of the Chinese application No. 202210484668.2, issued on Jun. 14, 2022, 24 pages.
Notice of Allowance of the Chinese application No. 202210484668.2, issued on Jun. 27, 2022, 6 pages.

* cited by examiner

112

111

13    12    11

112

111

Fourth
layer

Third
layer

Second
layer

First
layer

112

111

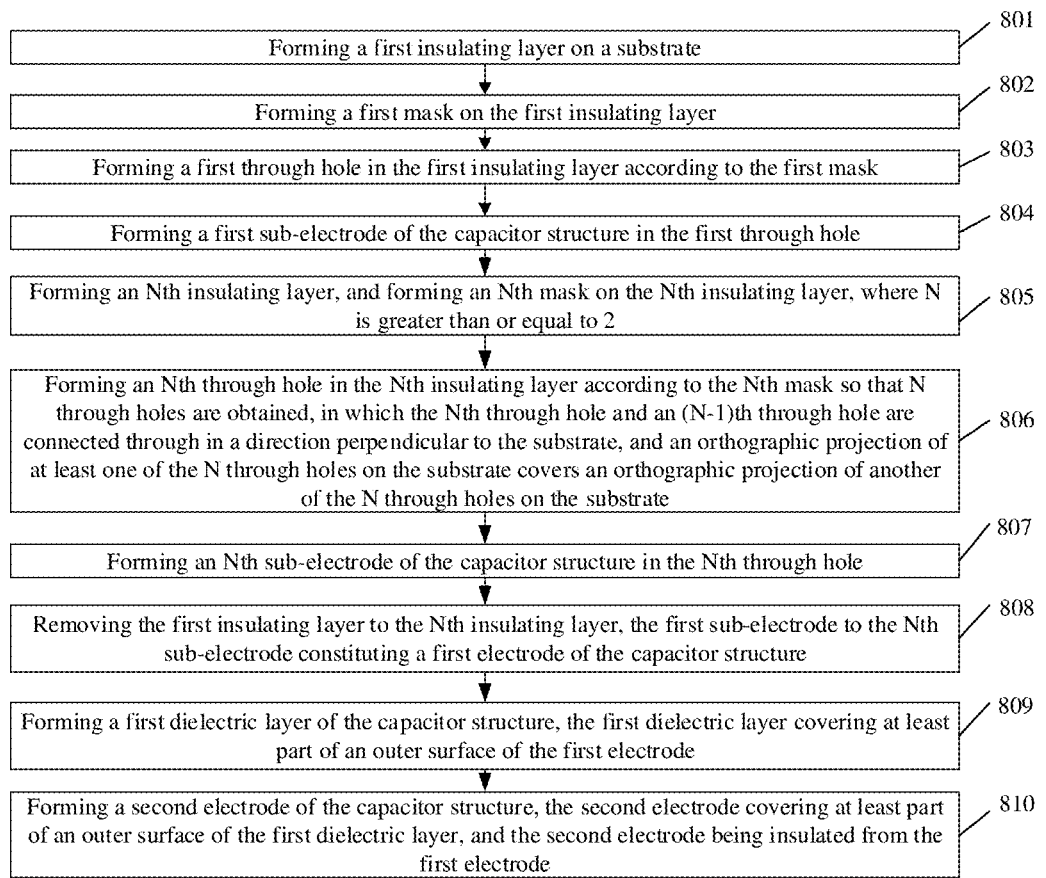

| Forming a first insulating layer on a substrate | 801 |

| Forming a first mask on the first insulating layer | 802 |

| Forming a first through hole in the first insulating layer according to the first mask | 803 |

| Forming a first sub-electrode of the capacitor structure in the first through hole | 804 |

| Forming an Nth insulating layer, and forming an Nth mask on the Nth insulating layer, where N is greater than or equal to 2 | 805 |

| Forming an Nth through hole in the Nth insulating layer according to the Nth mask so that N through holes are obtained, in which the Nth through hole and an (N-1)th through hole are connected through in a direction perpendicular to the substrate, and an orthographic projection of at least one of the N through holes on the substrate covers an orthographic projection of another of the N through holes on the substrate | 806 |

| Forming an Nth sub-electrode of the capacitor structure in the Nth through hole | 807 |

| Removing the first insulating layer to the Nth insulating layer, the first sub-electrode to the Nth sub-electrode constituting a first electrode of the capacitor structure | 808 |

| Forming a first dielectric layer of the capacitor structure, the first dielectric layer covering at least part of an outer surface of the first electrode | 809 |

| Forming a second electrode of the capacitor structure, the second electrode covering at least part of an outer surface of the first dielectric layer, and the second electrode being insulated from the first electrode | 810 |

CAPACITOR STRUCTURE AND METHOD FOR MANUFACTURING SAME, SEMICONDUCTOR STRUCTURE AND METHOD FOR MANUFACTURING SAME

CROSS-REFERENCE TO RELATED APPLICATIONS

The present application is a U.S. continuation application of International Application No. PCT/CN2022/105189, filed on Jul. 12, 2022, which claims priority to Chinese Patent Application No. 202210484668.2, filed on May 6, 2022. International Application No. PCT/CN2022/105189 and Chinese Patent Application No. 202210484668.2 are incorporated herein by reference in their entireties.

BACKGROUND

With the continuous shrinkage of semiconductor process technology, the cell area of transistors decreases significantly. In the DRAM, the size of a cell array transistor and the area of a unit capacitor also decrease, but the reduction of the area of capacitors will lead to the decrease of the unit capacitor storage, which makes it more difficult to read/write capacitors and affects the operation performance of the DRAM.

SUMMARY

In view of this, embodiments of the disclosure provide a capacitor structure and a method for manufacturing the same, and a semiconductor structure and a method for manufacturing the same.

In a first aspect of the embodiments of the disclosure, provided is a capacitor structure, which includes a substrate and a first electrode, a first dielectric layer and a second electrode that are arranged on the substrate, in which the first electrode includes at least two sub-electrodes continuously arranged in a direction perpendicular to the substrate and connected in sequence, of the at least two sub-electrodes, an orthographic projection of at least one of the sub-electrodes on the substrate covers an orthographic projection of another of the sub-electrodes on the substrate.

The first dielectric layer is arranged on at least part of an outer surface of the first electrode.

The second electrode is arranged on at least part of an outer surface of the first dielectric layer, and the second electrode is insulated from the first electrode.

In a second aspect of the embodiments of the disclosure, provided is a semiconductor structure, which includes at least one first capacitor structure of the embodiments of the first aspect described above and a second capacitor structure; in which the second capacitor structure includes the substrate and a third electrode, a second dielectric layer and a fourth electrode that are arranged on the substrate, the second dielectric layer is arranged on at least part of an outer surface of the third electrode, the fourth electrode is arranged on at least part of an outer surface of the second dielectric layer, and the fourth electrode is insulated from the third electrode; the first dielectric layer of the first capacitor structure and the second dielectric layer of the second capacitor structure that are adjacent are not connected, and the second electrode of the first capacitor structure and the fourth electrode of the second capacitor structure that are adjacent are connected.

According to a third aspect of embodiments of the disclosure, provided is a method for manufacturing a capacitor structure, which includes the following operations.

A first insulating layer is formed on a substrate.

A first mask is formed on the first insulating layer.

A first through hole is formed in the first insulating layer according to the first mask.

A first sub-electrode of the capacitor structure is formed in the first through hole.

An Nth insulating layer is formed, and an Nth mask is formed on the Nth insulating layer, where N is greater than or equal to 2.

An Nth through hole is formed in the Nth insulating layer according to the Nth mask so that N through holes are obtained, in which the Nth through hole and an (N−1)th through hole are connected through in a direction perpendicular to the substrate, an orthographic projection of at least one of the N through holes on the substrate covers an orthographic projection of another of the N through holes on the substrate.

An Nth sub-electrode of the capacitor structure is formed in the Nth through hole.

The first insulating layer to the Nth insulating layer are removed, in which the first sub-electrode to the Nth sub-electrode constitute a first electrode of the capacitor structure.

A first dielectric layer of the capacitor structure is formed, in which the first dielectric layer covers at least part of an outer surface of the first electrode.

A second electrode of the capacitor structure is formed, in which the second electrode covers at least part of an outer surface of the first dielectric layer, and the second electrode is insulated from the first electrode.

According to a fourth aspect of embodiments of the disclosure, provided is a method for manufacturing a semiconductor structure, which includes the following operations.

A first insulating layer is formed on a substrate.

A first mask is formed on the first insulating layer.

Two first through holes are formed in the first insulating layer according to the first mask.

Sub-electrodes of two capacitor structures are formed in the two first through holes.

An Nth insulating layer is formed, and an Nth mask is formed on the Nth insulating layer, where N is greater than or equal to 2.

At least one Nth through hole is formed in the Nth insulating layer according to the Nth mask, in which the Nth through hole and an (N−1)th through hole are connected through in a direction perpendicular to the substrate so that N through holes are connected, an orthographic projection of at least one of the N through holes on the substrate covers an orthographic projection of another of the N through holes on the substrate.

At least one Nth sub-electrode of the capacitor structure is formed in the at least one Nth through hole.

The first insulating layer to the Nth insulating layer are removed, at least two sub-electrodes form a first electrode of a first capacitor structure, and at least one sub-electrode forms a third electrode of a second capacitor structure.

A first dielectric layer of the first capacitor structure and a second dielectric layer of the second capacitor structure are formed, in which the first dielectric layer covers at least part of an outer surface of the first electrode, the second dielectric layer covers at least part of an outer surface of the third electrode, the first dielectric layer and the second dielectric layer are not connected.

A second electrode of the first capacitor structure and a fourth electrode of the second capacitor structure are formed, in which the second electrode covers at least part of an outer surface of the first dielectric layer, the fourth electrode covers at least part of an outer surface of the second dielectric layer, and the second electrode is insulated from the first electrode, the third electrode is insulated from the fourth electrode, and the second electrode and the fourth electrode are connected.

BRIEF DESCRIPTION OF THE DRAWINGS

In order to more clearly illustrate the embodiments of the disclosure or the technical solution in the conventional technique, a brief description of the drawings required to be used in the embodiments will be provided below. Apparently, the drawings of the following description are merely some embodiments of the disclosure. For a person of ordinary skill in the art, other drawings can be obtained based on these drawings without creative work.

FIG. 8 is a flowchart of a method for manufacturing a capacitor structure provided by an embodiment of the disclosure;

DETAILED DESCRIPTION

Figure 1:
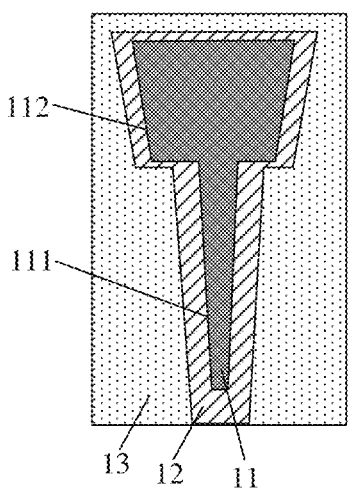
FIG. 1 is a schematic cross-sectional diagram of a capacitor structure provided by an embodiment of the disclosure.

The disclosure relates to, but is not limited to, a capacitor structure and a method for manufacturing the same, and a semiconductor structure and a method for manufacturing the same.

Exemplary embodiments of the present disclosure will be described in more detail below with reference to the accompanying drawings. Although exemplary embodiments of the present disclosure are shown in the drawings, it should be understood that the present disclosure may be implemented in various forms and should not be limited to the specific embodiments set forth herein. These embodiments are provided so that the disclosure will be more thoroughly understood and the scope of the disclosure will be fully conveyed to those skilled in the art.

In the description below, numerous specific details are given to provide a more thorough understanding of the disclosure. However it will be apparent to those skilled in the art that the disclosure may be implemented without one or more of these details. In other examples, some technical features well-known in the art are not described in order to avoid confusion with the present disclosure; that is, not all of the features of actual embodiments are described herein, and well-known functions and structures are not described in detail.

In the drawings, the dimensions of layers, regions, elements and their relative dimensions may be exaggerated for clarity. The same reference numeral denotes the same element throughout the text.

It should be understood that when an element or a layer is referred to as "on", "adjacent to", "connected to" or "coupled to" another element or layer, it may be directly on the other element or layer, adjacent to the other element or layer, or connected to or coupled to the other element or layer, or there may be an intermediate element or layer therebetween. In contrast, when an element is described as "directly on", "directly adjacent to", "directly connected to" or "directly coupled to" another element or layer, there is no intermediate element or layer therebetween. It should be understood that although the terms, "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

Spatial relationship terms such as "beneath", "below", "lower", "under", "above", or "upper" may be used herein for convenience to describe a relationship between one element or feature and another element or feature shown in the drawings. It should be understood, the spatial relationship terms tend to further include different orientations of a device in use and operation in addition to the orientations shown in the drawings. For example, if the device in the drawings is turned over, an element or feature described as being "below" or "under" or "beneath" another element will be oriented as being "above" the other element or feature. Therefore, the exemplary terms "below" and "under" may include up and down orientations. The device may also include additional orientations (e.g., rotation for 90 degrees or other orientations), and the spatial terms used herein are interpreted accordingly.

The terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that when terms "consist of" and/or "comprise/include" used in the specification mean that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

In order to thoroughly understand the present disclosure, detailed operations and structures will be set forth in the following description in order to illustrate the technical solution of the present disclosure. Preferred embodiments of the present disclosure are described in detail below. However the present disclosure may have other embodiments in addition to these detailed descriptions.

Figure 2:
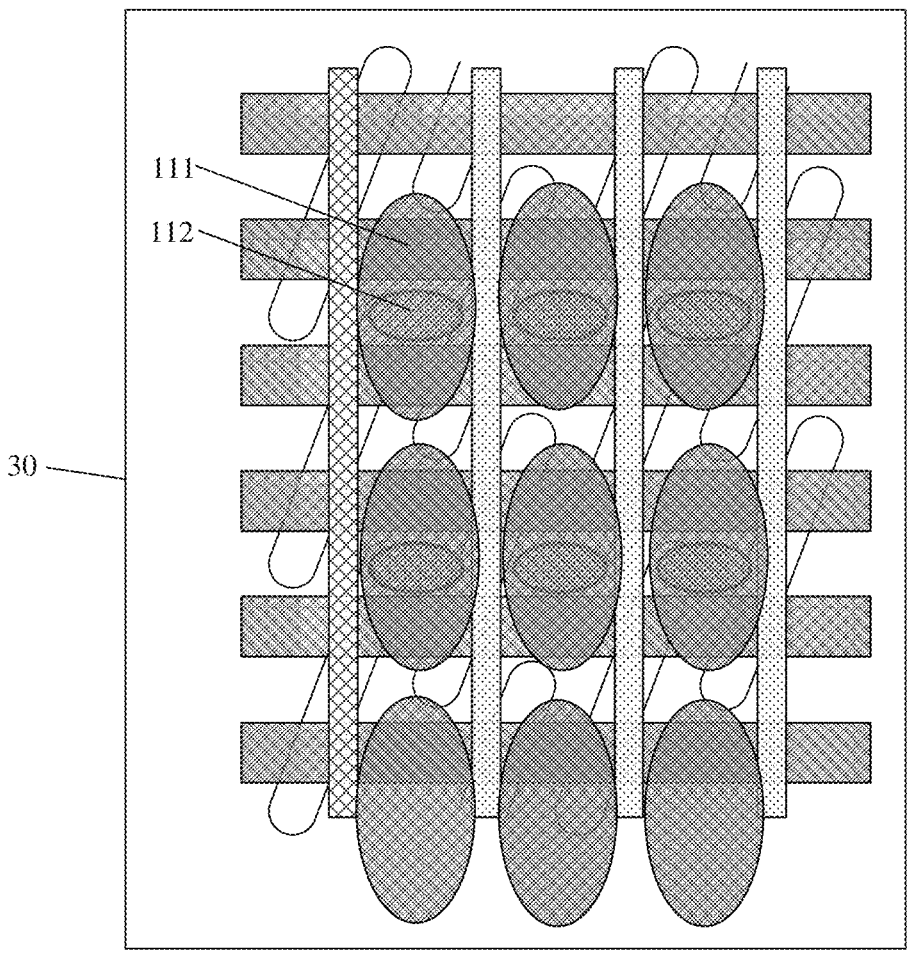
FIG. 2 is a top view of a capacitor structure provided by an embodiment of the disclosure.

In view of this, embodiments of the disclosure provide a capacitor structure. FIG. 1 is a schematic cross-sectional diagram of a capacitor structure provided by an embodiment of the disclosure; and FIG. 2 is a top view of a capacitor structure provided by an embodiment of the disclosure. It should be noted that a first electrode in the capacitor structure shown in FIG. 1 and FIG. 2 only includes two sub-electrodes.

With reference to FIG. 1 and FIG. 2, the capacitor structure includes a substrate 30 and a first electrode 11, a first dielectric layer 12 and a second electrode 13 arranged on the substrate 30, in which the first electrode 11 includes at least two sub-electrodes continuously arranged in a direction perpendicular to the substrate 30 and connected in sequence, of the at least two sub-electrodes, an orthographic projection of at least one of the sub-electrodes on the substrate 30 covers an orthographic projection of another of the sub-electrodes on the substrate 30; the first dielectric layer 12 is arranged on at least part of an outer surface of the first electrode 11; the second electrode 13 is arranged on at least part of an outer surface of the first dielectric layer 12, and the second electrode 13 is insulated from the first electrode 11.

In the embodiments of the disclosure, a multi-stage capacitor structure is formed, and of the plurality of sub-electrodes of the first electrode of the capacitor structure, at least one sub-electrode occupies a larger area, as such, the area of the capacitor is increased, thereby increasing the capacity of the battery capacitor. Meanwhile, the sub-electrodes occupied a smaller area allows a sufficient space between the capacitor structures, thus reducing the problem of mutual contact between each capacitor structure.

The substrate 30 may be a silicon substrate, a germanium substrate, a silicon germanium substrate, a silicon carbide substrate, an SOI (Silicon On Insulator) substrate, a GOI (Germanium On Insulator) substrate, or the like. Also, it may be a substrate including other element semiconductor or compound semiconductor, such as a glass substrate or a Group III-V compound substrate (such as gallium nitride substrate or gallium arsenide substrate, or the like). Further, it may be a laminated structure, such as Si/SiGe, or the like, and may be another epitaxial structure, such as SGOI (Silicon Germanium On Insulator), or the like.

In an embodiment, the first electrode 11 includes a first sub-electrode 111 and a second sub-electrode 112 continuously arranged in the direction perpendicular to the substrate 30 and connected in sequence. The first sub-electrode 111 is closer to the substrate 30 compared to the second sub-electrode 112; the orthographic projection of the first sub-electrode 111 on the substrate 30 covers the orthographic projection of the second sub-electrode 112 on the substrate 30; or, the orthographic projection of the second sub-electrode 112 on the substrate 30 covers the orthographic projection of the first sub-electrode 111 on the substrate 30.

Figure 3A:
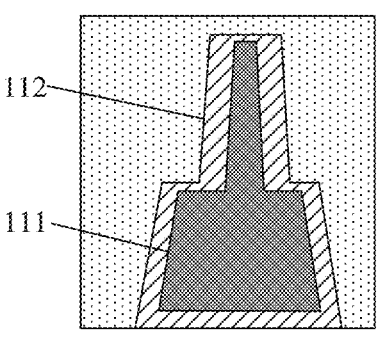
FIG. 3A is a schematic cross-sectional diagram of a capacitor structure provided by one embodiment of the disclosure.

Specifically, in some embodiments, as shown in FIG. 1 and FIG. 2, the orthographic projection of the second sub-electrode 112 on the substrate 30 covers the orthographic projection of the first sub-electrode 111 on the substrate 30. In other embodiments, as shown in FIG. 3A, the orthographic projection of the first sub-electrode 111 on the substrate 30 covers the orthographic projection of the second sub-electrode 112 on the substrate 30.

In an embodiment, the first electrode 11 includes N sub-electrodes continuously arranged in the direction perpendicular to the substrate 30 and connected in sequence, and N is greater than or equal to 3. The orthographic projection area of odd-numbered sub-electrodes on the substrate 30 is smaller than the orthographic projection area of even-numbered sub-electrodes on the substrate 30; or, the orthographic projection area of the odd-numbered sub-electrodes on the substrate 30 is larger than the orthographic projection area of the even-numbered sub-electrodes on the substrate 30.

Figure 3B:
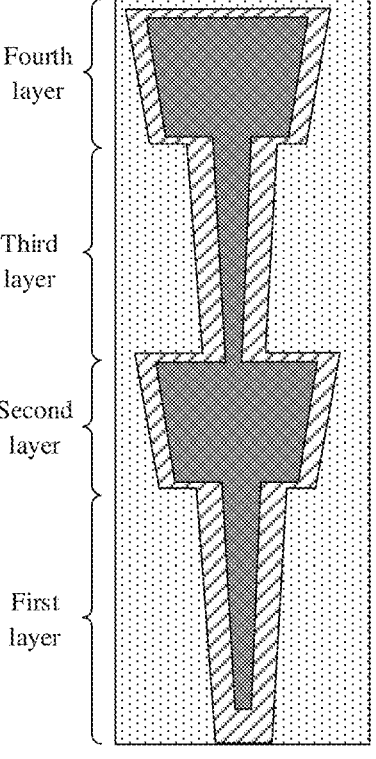
FIG. 3B is a schematic cross-sectional diagram of a capacitor structure provided by another embodiment of the disclosure.
Figure 3C:
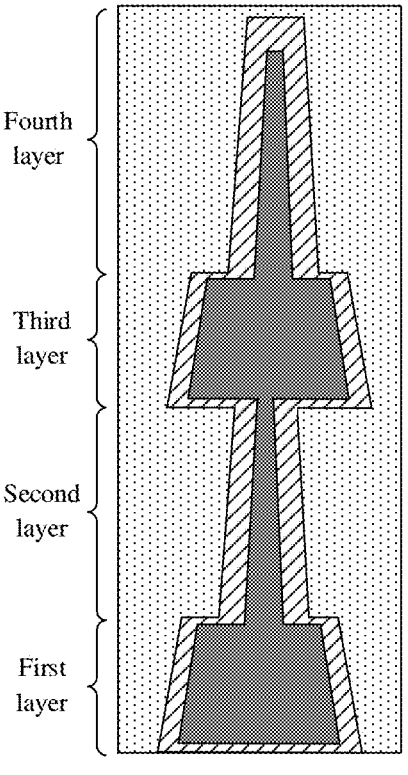
FIG. 3C is a schematic cross-sectional diagram of a capacitor structure provided by yet another embodiment of the disclosure.

Specifically, in some embodiments, as shown in FIG. 3B, the orthographic projection area of the sub-electrode of the first layer and the sub-electrode of the third layer on the substrate are smaller than the orthographic projection area of the sub-electrode of the second layer and the sub-electrode of the fourth layer on the substrate. In other embodiments, as shown in FIG. 3C, the orthographic projection area of the sub-electrode of the first layer and the sub-electrode of the third layer on the substrate is larger than the orthographic projection area of the sub-electrode of the second layer and the sub-electrode of the fourth layer on the substrate.

In an embodiment, as shown in FIG. 1, in the projection on a plane parallel to the substrate 30, the projection of the second sub-electrode 112 has equal areas at both sides of the projection of the first sub-electrode 111.

Specifically, as shown in FIG. 1, the second sub-electrode 112 is symmetrically arranged along the axis of the first sub-electrode 111. In this embodiment, there is no problem of short connection between capacitors.

Figure 3D:
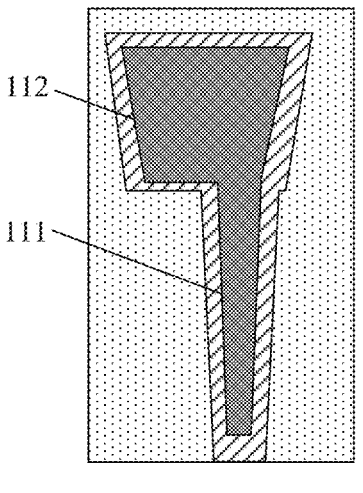
FIG. 3D is a schematic cross-sectional diagram of a capacitor structure provided by still another embodiment of the disclosure.

In other embodiments, as shown in FIG. 3D, in the projection on a plane parallel to the substrate 30, the projection of the second sub-electrode 112 is different at both sides of the projection of the first sub-electrode 111.

Figure 4:
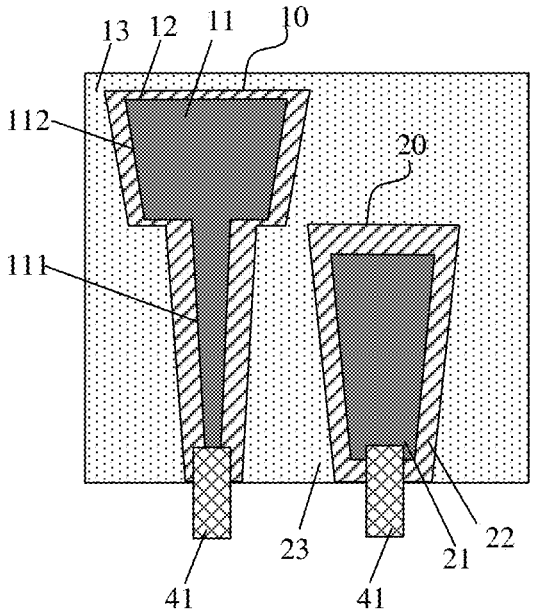
FIG. 4 is a schematic cross-sectional diagram of a semiconductor structure provided by an embodiment of the disclosure.

Embodiments of the disclosure further provide a semiconductor structure. FIG. 4 is a schematic cross-sectional diagram of a semiconductor structure provided by an embodiment of the disclosure; and FIG. 5 is a top view of a semiconductor structure provided by an embodiment of the disclosure.

Figure 5:
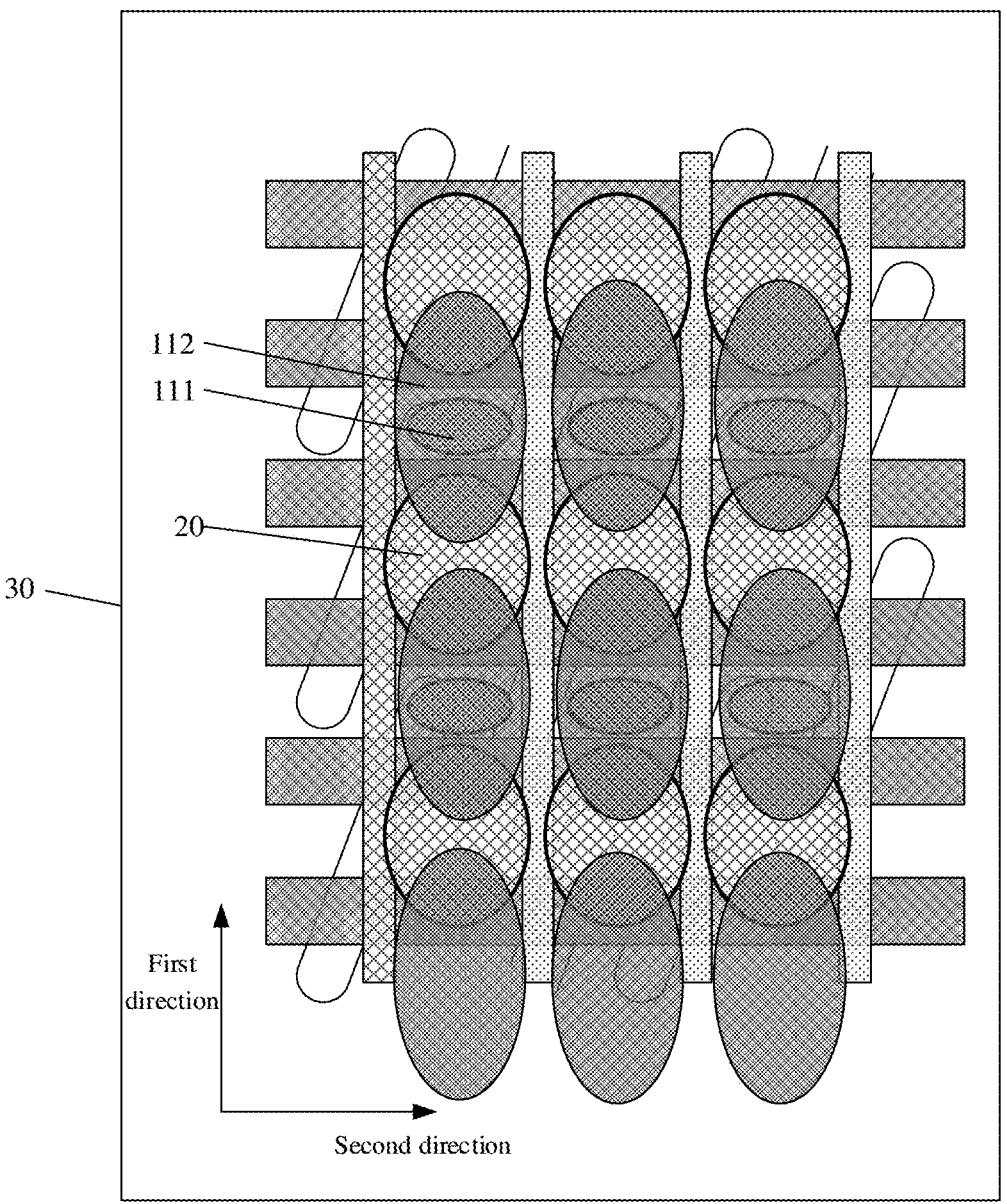
FIG. 5 is a top view of a semiconductor structure provided by an embodiment of the disclosure.

As shown in FIG. 4 and FIG. 5, the semiconductor structure includes at least one first capacitor structure 10 of the embodiments described above and a second capacitor structure 20; in which the second capacitor structure 20 includes a substrate 30 and a third electrode 21, a second dielectric layer 22 and a fourth electrode 23 arranged on the substrate 30, the second dielectric layer 22 is arranged on at least part of an outer surface of the third electrode 21, the fourth electrode 23 is arranged on at least part of an outer surface of the second dielectric layer 22, and the fourth electrode 23 is insulated from the third electrode 21; the first dielectric layer 12 of the first capacitor structure 10 and the second dielectric layer 22 of the second capacitor structure 20 that are adjacent are not connected, and the second electrode 13 of the first capacitor structure 10 and the fourth electrode 23 of the second capacitor structure 20 that are adjacent are connected.

In an embodiment, as shown in FIG. 5, the first capacitor structure 10 and the second capacitor structure 20 are arranged at intervals along a first direction.

In an embodiment, the first capacitor structure includes the first electrode 11, the first dielectric layer 12, and the second electrode 13.

In an embodiment, as shown in FIG. 4, the first electrode 11 includes a first sub-electrode 111 and a second sub-electrode 112 continuously arranged in the direction perpendicular to the substrate 30 and connected in sequence; in which the first sub-electrode 111 is closer to the substrate compared to the second sub-electrode 112; the orthographic projection of the second sub-electrode 112 on the substrate 30 covers the orthographic projection of the first sub-electrode 111 on the substrate 30; the orthographic projection area of the first sub-electrode 111 on the substrate 30 is smaller than the orthographic projection area of the third electrode 21 on the substrate 30.

In an embodiments, as shown in FIG. 4 and FIG. 5, the orthographic projection of the second sub-electrode 112 of the first capacitor structure 10 on the substrate 30 overlaps the orthographic projection of the third electrode 21 of the second capacitor structure 20 on the substrate 30.

The orthographic projection of the second sub-electrode on the substrate overlaps the orthographic projection of the third electrode on the substrate, but since the second sub-electrode and the third electrode are not in the same layer and are not in contact with each other. Thus, the semiconductor structures in the embodiment of the disclosure can make more full use of space, compared to forming capacitor structures of the same number and the same shape in each layer, so that the area of each capacitor structure is sufficiently large.

Figure 6A:
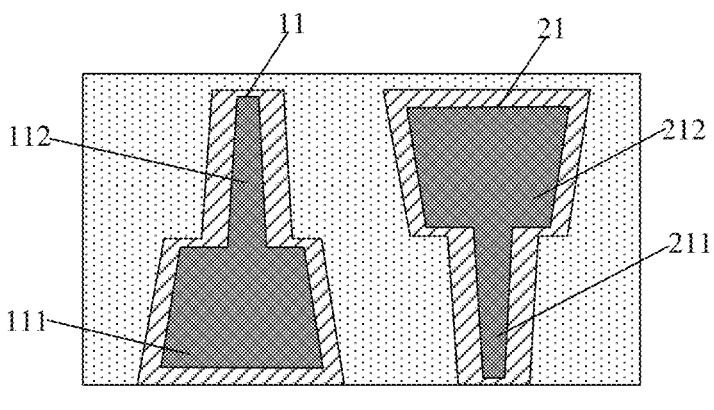
FIG. 6A is a schematic cross-sectional diagram of a semiconductor structure provided by one embodiment of the disclosure.

In an embodiment, as shown in FIG. 6A, the first electrode 11 includes a first sub-electrode 111 and a second sub-electrode 112 continuously arranged in the direction perpendicular to the substrate 30 and connected in sequence, in which the first sub-electrode 111 is closer to the substrate 30 compared to the second sub-electrode 112; the third electrode 21 includes a third sub-electrode 211 and a fourth sub-electrode 212 continuously arranged in the direction perpendicular to the substrate 30 and connected in sequence, in which the third sub-electrode 211 is closer to the substrate 30 compared to the fourth sub-electrode 212.

The orthographic projection of the second sub-electrode 112 on the substrate 30 covers the orthographic projection of the first sub-electrode 111 on the substrate 30, the orthographic projection of the third sub-electrode 211 on the substrate 30 covers the orthographic projection of the fourth sub-electrode 212 on the substrate 30, and the orthographic projection area of the first sub-electrode 111 on the substrate 30 is smaller than the orthographic projection area of the third sub-electrode 211 on the substrate 30, or, the orthographic projection of the first sub-electrode 111 on the substrate 30 covers the orthographic projection of the second sub-electrode 112 on the substrate 30, the orthographic projection of the fourth sub-electrode 212 on the substrate 30 covers the orthographic projection of the third sub-electrode 211 on the substrate 30, and the orthographic projection area of the first sub-electrode 111 on the substrate 30 is larger than the orthographic projection area of the third sub-electrode 211 on the substrate 30.

In an embodiment, the first electrode 11 includes N sub-electrodes continuously arranged in the direction perpendicular to the substrate and connected in sequence, where N is greater than or equal to 3. Specifically, in some embodiments, FIG. 6B illustrates a case where N=4, and FIG. 6C and FIG. 6D illustrate cases where N=3.

The third electrode 21 includes M sub-electrodes continuously arranged in the direction perpendicular to the substrate and connected in sequence, where M is greater than or equal to 2, and M is less than or equal to N. Specifically, in some embodiments, FIG. 6B illustrates a case where M=4, and FIG. 6C and FIG. 6D illustrate cases where M=2.

The orthographic projection area of odd-numbered sub-electrodes of the first electrode on the substrate is larger than the orthographic projection area of even-numbered sub-electrodes of the first electrode on the substrate, and the orthographic projection area of odd-numbered sub-electrodes of the third electrode on the substrate is smaller than the orthographic projection area of even-numbered sub-electrodes of the third electrode on the substrate; the orthographic projection area of the odd-numbered sub-electrodes of the first electrode on the substrate is larger than the orthographic projection area of the odd-numbered sub-electrodes of the third electrode on the substrate, the orthographic projection area of the even-numbered sub-electrodes of the first electrode on the substrate is smaller than the orthographic projection area of the even-numbered sub-electrodes of the third electrode on the substrate; or, the orthographic projection area of the odd-numbered sub-electrodes of the first electrode on the substrate is smaller than the orthographic projection area of the even-numbered sub-electrodes of the first electrode on the substrate, and the orthographic projection area of the odd-numbered sub-electrodes of the third electrode on the substrate is larger than the orthographic projection area of the even-numbered sub-electrodes of the third electrode on the substrate; the orthographic projection area of the odd-numbered sub-electrodes of the first electrode on the substrate is smaller than the orthographic projection area of the odd-numbered sub-electrodes of the third electrode on the substrate, the orthographic projection area of the even-numbered sub-electrodes of the first electrode on the substrate is larger than the orthographic projection area of the even-numbered sub-electrodes of the third electrode on the substrate.

Figure 6B:
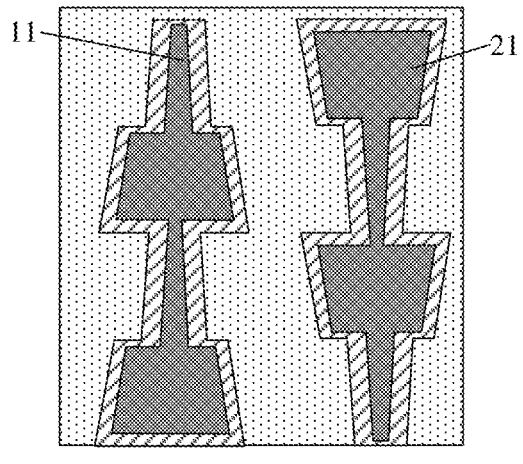
FIG. 6B is a schematic cross-sectional diagram of a semiconductor structure provided by another embodiment of the disclosure.
Figure 6C:
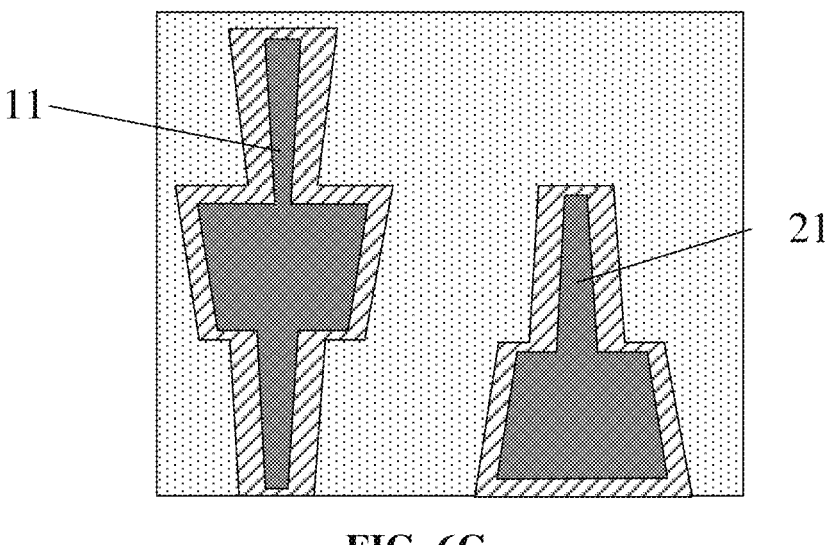
FIG. 6C is a schematic cross-sectional diagram of a semiconductor structure provided by another embodiment of the disclosure.
Figure 6D:
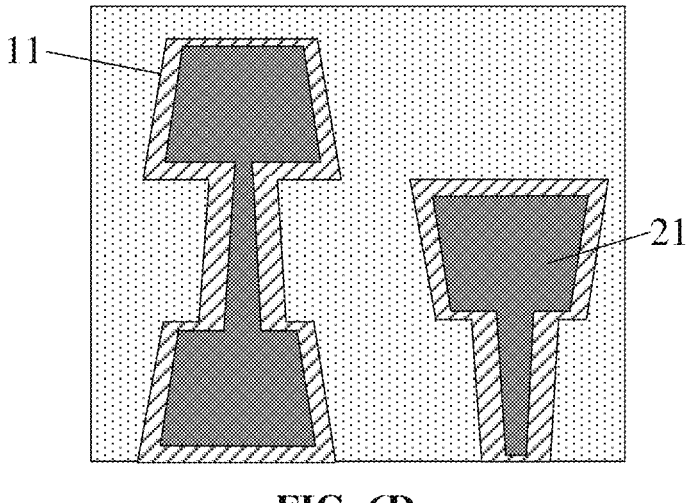
FIG. 6D is a schematic cross-sectional diagram of a semiconductor structure provided by another embodiment of the disclosure.

Specifically, in some embodiments, as shown in FIG. 6B, the orthographic projection area of the sub-electrode of the first layer and the sub-electrode of the third layer of the first electrode 11 on the substrate are larger than the orthographic projection area of the sub-electrode of the first layer and the sub-electrode of the third layer of the third electrode 21, the orthographic projection area of the sub-electrode of the second layer and the sub-electrode of the fourth layer of the first electrode 11 on the substrate are smaller than the orthographic areas of the sub-electrode of the second layer and the sub-electrode of the fourth layer of the third electrode 21 on the substrate.

In other embodiments, the orthographic projection area of the sub-electrode of the first layer and the sub-electrode of the third layer of the first electrode on the substrate are smaller than the orthographic projection area of the sub-electrode of the first layer and the sub-electrode of the third layer of the third electrode, the orthographic projection area of the sub-electrode of the second layer and the sub-electrode of the fourth layer of the first electrode on the substrate are larger than the orthographic areas of the sub-electrode of the second layer and the sub-electrode of the fourth layer of the third electrode on the substrate (not shown).

Figure 7:
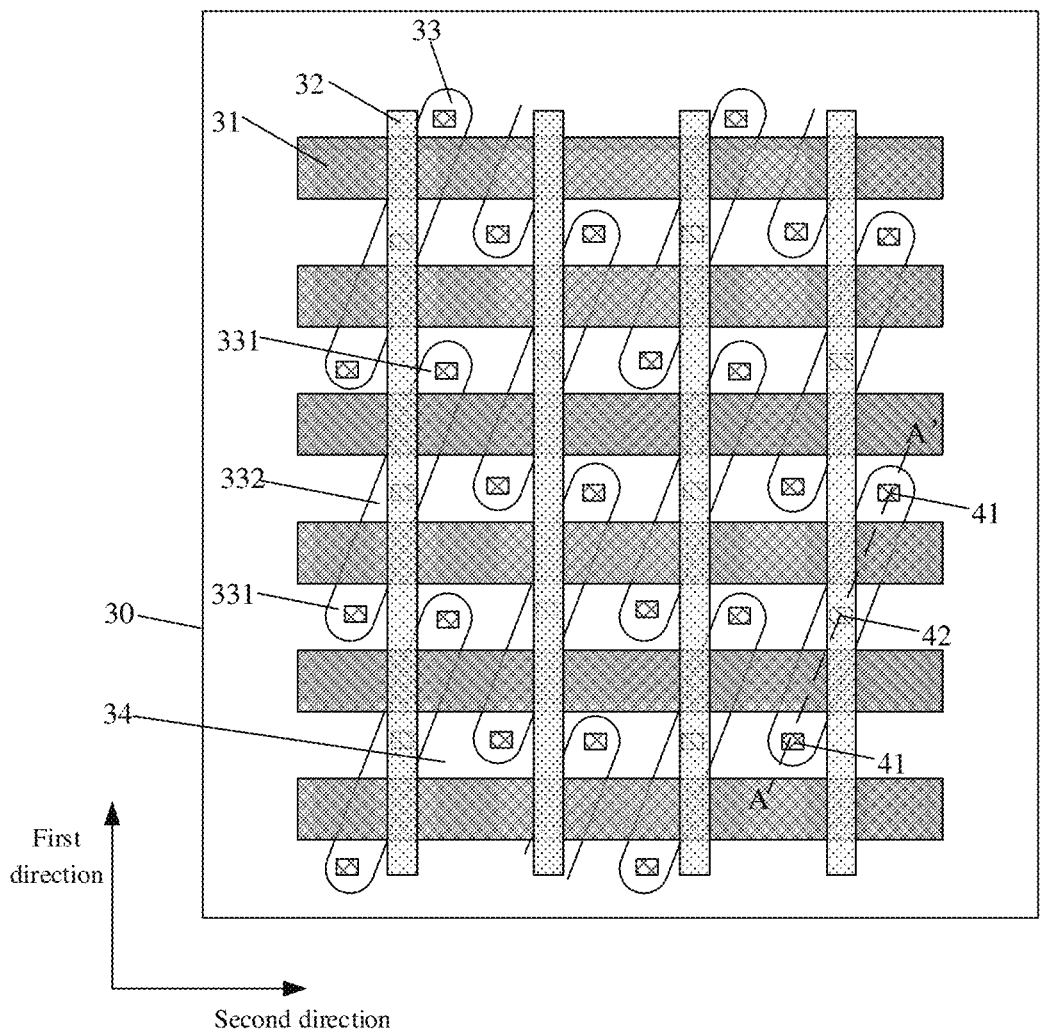
FIG. 7 is a top view of a partial structure of a semiconductor structure provided by an embodiment of the disclosure.

FIG. 7 is a top view of a partial structure of a semiconductor structure provided by an embodiment of the disclosure, in which the capacitor structures are not shown in FIG. 7.

As shown in FIG. 7, in an embodiment, a substrate 30 includes a plurality of word lines 31 extending in a second direction and a plurality of active areas that are discrete 33; each of the active areas 33 includes two first source/drain ends 331 respectively located on both sides and a second source/drain end 332 located in the middle.

The semiconductor structure further includes a plurality of bit lines 32, first conductive plugs 41, and second conductive plugs 42. The plurality of bit lines 32 are located on the substrate 30 and extend along the first direction.

The first conductive plugs 41 are located below the first capacitor structure 10 and the second capacitor structure 20. The first capacitor structure 10 and the second capacitor structure 20 are electrically connected with the two first source/drain ends 331 of the corresponding active area 33 through the first conductive plugs 41.

The second conductive plugs 42 are located below the bit lines 32. The bit lines 32 are electrically connected with the second source/drain ends 332 of the active areas 33 through the second conductive plugs 42.

With reference to FIG. 7, the substrate 30 further includes an isolation structure 34 which defines the substrate 30 as a plurality of active areas that are discrete 33. The material of the isolation structure 34 may include at least one of an oxide (e.g. silicon oxide), a nitride (e.g. silicon nitride), or an oxynitride (e.g. silicon oxynitride).

With reference to FIG. 7, the two first source/drain ends 331 respectively located on both sides and the second source/drain end 332 located in the middle of each active area 33 are spaced by two word lines 31.

The first source/drain ends 331 and the second source/drain end 332 may be formed within the active area 33 by ion implantation. In a specific embodiment, the first source/drain ends 331 and the second source/drain end 332 have the same conductivity type, such as n-type.

The materials of the word lines 31 and the bit lines 32 include tungsten (W), copper (Cu), titanium (Ti), tantalum (Ta), titanium nitride (TiN), tantalum nitride (TaN), a metal silicide, a metal alloy, or any combination thereof.

The materials of the first conductive plugs 41 and the second conductive plug 42 are, for example, tungsten (W), copper (Cu), titanium (Ti), tantalum (Ta), titanium nitride (TiN), tantalum nitride (TaN), polysilicon, or a combination thereof.

In an embodiment, the materials of the first electrode 11, the second electrode 13, the third electrode 21 and the fourth electrode 23 include a metal. The materials of the first dielectric layer 12 and the second dielectric layer 22 include a high-K dielectric material.

Specifically, the materials of the first electrode 11 and the third electrode 21 include, but are not limited to, titanium nitride. The materials of the second electrode 13 and the fourth electrode 23 include, but are not limited to, polysilicon or germanium silicon.

The materials of the first dielectric layer 12 and the second dielectric layer 22 include a high-K dielectric material. In particular, the high-K dielectric material may include, but are not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_XO_Y$), hafnium oxide ($HfO_2$), Hafnium silicon oxide ($HfSi_XO_Y$), hafnium silicon oxynitride (HfSiON), hafnium zirconate ($HfZrO_4$), lanthanum oxide ($La_2O_3$), lanthanum aluminium oxide ($LaAl_XO_Y$), lanthanum hafnium oxide ($LaHf_XO_Y$), hafnium aluminum oxide ($HfAl_XO_Y$), and/or praseodymium oxide ($Pr_2O_3$).

By using a high-K dielectric material as the materials of the first dielectric layer 12 and the second dielectric layer 22, the capacity of the capacitor structure can be improved.

Embodiments of the disclosure further provide a method for manufacturing a capacitor structure. Specifically referring to FIG. 8, as shown in the figure, the method includes the following operations.

At S801, a first insulating layer is formed on a substrate.

At S802, a first mask is formed on the first insulating layer.

At S803, a first through hole is formed in the first insulating layer according to the first mask.

At S804, a first sub-electrode of the capacitor structure is formed in the first through hole.

At S805, an Nth insulating layer is formed, and an Nth mask is formed on the Nth insulating layer, where N is greater than or equal to 2.

At S806, an Nth through hole is formed in the Nth insulating layer according to the Nth mask so that N through holes are obtained, in which the Nth through hole and an (N−1)th through hole are connected through in a direction perpendicular to the substrate, an orthographic projection of at least one of the N through holes on the substrate covers an orthographic projection of another of the N through holes on the substrate.

At S807, an Nth sub-electrode of the capacitor structure is formed in the Nth through hole.

At S808, the first insulating layer to the Nth insulating layer are removed, in which the first sub-electrode to the Nth sub-electrode constitute a first electrode of the capacitor structure.

At S809, a first dielectric layer of the capacitor structure is formed, in which the first dielectric layer covers at least part of an outer surface of the first electrode.

At S810, a second electrode of the capacitor structure is formed, in which the second electrode covers at least part of an outer surface of the first dielectric layer, and the second electrode is insulated from the first electrode.

The method for manufacturing a capacitor structure provided by the embodiments of the disclosure will be described in further detail below in combination with specific embodiments.

FIG. 9A to FIG. 9K are schematic structural diagrams of a capacitor structure in the manufacturing process provided by an embodiment of the disclosure.

Figure 9A:
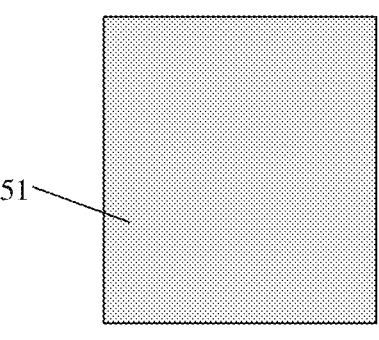
FIG. 9A is a first schematic structural diagram of a capacitor structure in the manufacturing process provided by an embodiment of the disclosure.

First, with reference to FIG. 9A, S801 is performed, in which a first insulating layer 51 is formed on a substrate (not shown in the figure).

In practice, the first insulating layer 51 may be formed by one or more thin film deposition processes. Specifically, the deposition process includes, but is not limited to, chemical vapor deposition (CVD), plasma enhanced chemical vapor deposition (PECVD), atomic layer deposition (ALD), or a combination thereof.

Figure 9B:
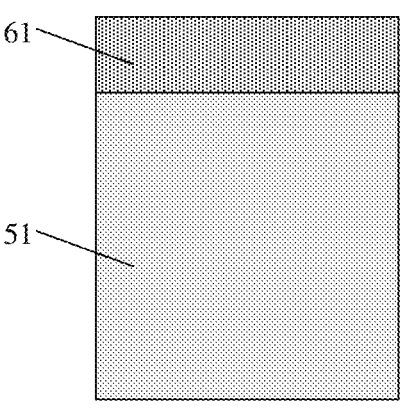
FIG. 9B is a second schematic structural diagram of a capacitor structure in the manufacturing process provided by an embodiment of the disclosure.

Next, with reference to FIG. 9B, S802 is performed, in which a first mask 61 is formed on the first insulating layer 51.

Figure 9C:
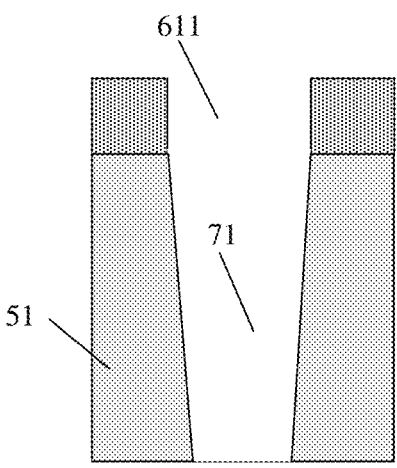
FIG. 9C is a third schematic structural diagram of a capacitor structure in the manufacturing process provided by an embodiment of the disclosure.

Next, with reference to FIG. 9C, S803 is performed, in which a first through hole 71 is formed in the first insulating layer 51 according to the first mask 61.

Specifically, the first mask 61 may be patterned to form a first mask pattern 611. According to the first mask pattern 611, the first through hole 71 is formed in the first insulating layer 51.

Specifically, the first mask may be a photoresist mask or a hard mask patterned based on a photolithography mask; when the first mask is a photoresist mask, the first mask is patterned through the operations of exposure, development, glue removal, and the like. Next, the first through hole with a certain depth is etched out according to the pattern to be etched.

Next, after the first through hole 71 is formed, the remaining first mask is removed.

Figure 9D:
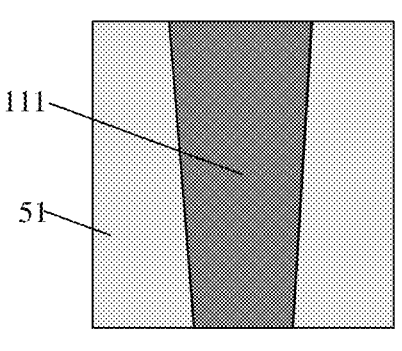
FIG. 9D is a fourth schematic structural diagram of a capacitor structure in the manufacturing process provided by an embodiment of the disclosure.

Next, with reference to FIG. 9D, S804 is performed, in which a first sub-electrode 111 of the capacitor structure is formed in the first through hole 71.

Next, S805 is performed, in which an Nth insulating layer is formed, and an Nth mask is formed on the Nth insulating layer, where N is greater than or equal to 2.

Figure 9E:
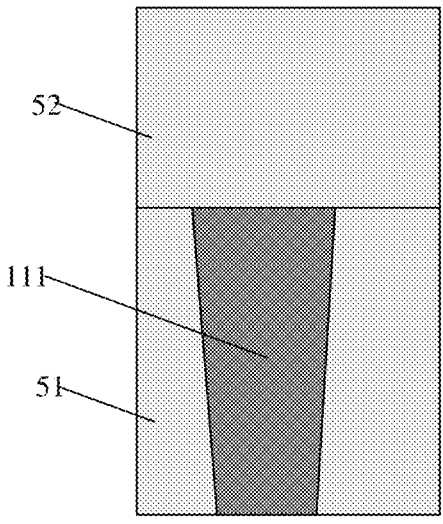
FIG. 9E is a fifth schematic structural diagram of a capacitor structure in the manufacturing process provided by an embodiment of the disclosure.
Figure 9F:
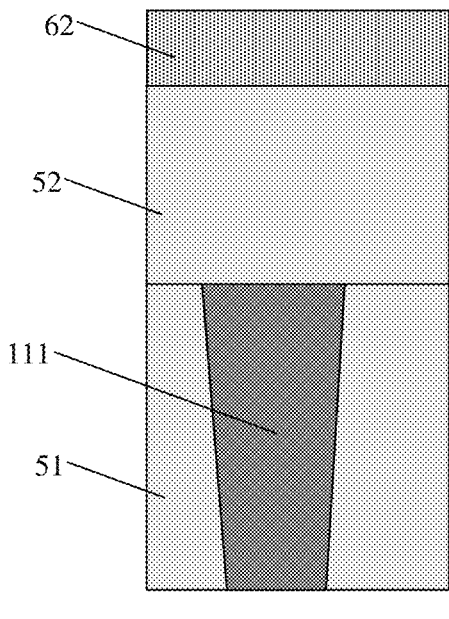
FIG. 9F is a sixth schematic structural diagram of a capacitor structure in the manufacturing process provided by an embodiment of the disclosure.

Specifically, N equals 2 is taken as an example in this embodiment. With reference to FIG. 9E and FIG. 9F, a second insulating layer 52 is formed, and a second mask 62 is formed on the second insulating layer 52.

In practice, the second insulating layer 52 may be formed by one or more thin film deposition processes. Specifically, the deposition process includes, but is not limited to, chemical vapor deposition (CVD), plasma enhanced chemical vapor deposition (PECVD), atomic layer deposition (ALD), or a combination thereof.

Next, S806 is performed, in which an Nth through hole is formed in the Nth insulating layer according to the Nth mask so that N through holes are obtained. The Nth through hole and an (N−1)th through hole are connected through in a direction perpendicular to the substrate. The orthographic projection of at least one of the N through holes on the substrate covers the orthographic projection of another of the N through holes on the substrate.

Next, after the Nth through hole is formed, the remaining Nth mask is removed.

Figure 9G:
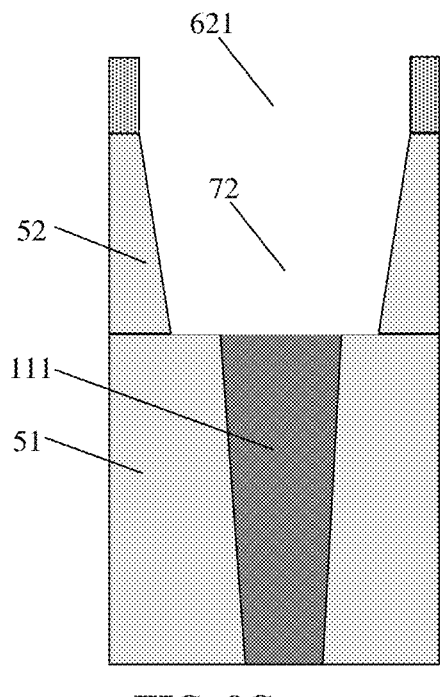
FIG. 9G is a seventh schematic structural diagram of a capacitor structure in the manufacturing process provided by an embodiment of the disclosure.

Specifically, with reference to FIG. 9G, a second through hole 72 is formed in the second insulating layer 52 according to the second mask 62. The second through hole 72 and the first through hole 71 are connected through in the direction perpendicular to the substrate, the orthographic projection of the second through hole 72 on the substrate covers the orthographic projection of the first through hole 71 on the substrate.

Specifically, the second mask 62 may be patterned to form a second mask pattern 621. According to the second mask pattern 621, the second through hole 72 is formed in the second insulating layer 52.

Specifically, the second mask may be a photoresist mask or a hard mask patterned based on a photolithography mask; when the second mask is a photoresist mask, the second mask is patterned through the operations of exposure, development, glue removal, and the like. Next, the second through hole with a certain depth is etched out according to the pattern to be etched.

Next, S807 is performed, in which an Nth sub-electrode of the capacitor structure is formed in the Nth through hole.

Figure 9H:
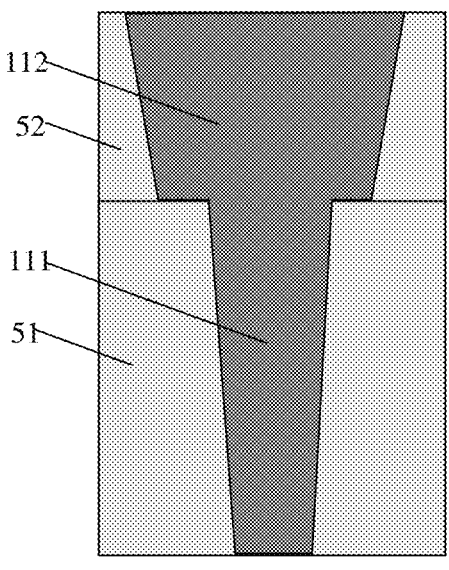
FIG. 9H is an eighth schematic structural diagram of a capacitor structure in the manufacturing process provided by an embodiment of the disclosure.

Specifically, with reference to FIG. 9H, a second sub-electrode 112 of the capacitor structure is formed in the second through hole 72.

Next, S808 is performed, in which the first insulating layer to the Nth insulating layer are removed, and the first sub-electrode to the Nth sub-electrode constitute a first electrode of the capacitor structure.

Figure 9I:
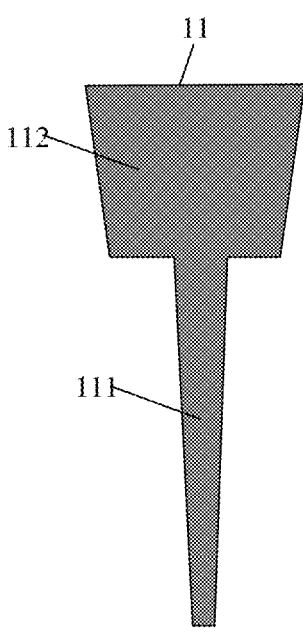
FIG. 9I is a ninth schematic structural diagram of a capacitor structure in the manufacturing process provided by an embodiment of the disclosure.

Specifically, with reference to FIG. 9I, the first insulating layer 51 and the second insulating layer 52 are removed, and the first sub-electrode 111 and the second sub-electrode 112 constitute the first electrode 11 of the capacitor structure.

Figure 9J:
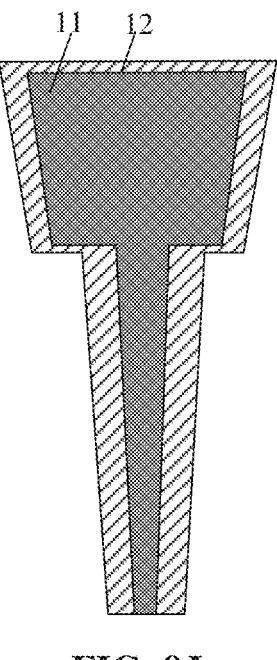
FIG. 9J is a tenth schematic structural diagram of a capacitor structure in the manufacturing process provided by an embodiment of the disclosure.

Next, with reference to FIG. 9J, S809 is performed, in which a first dielectric layer 12 of the capacitor structure is formed, the first dielectric layer covers at least part of an outer surface of the first electrode 11.

Figure 9K:
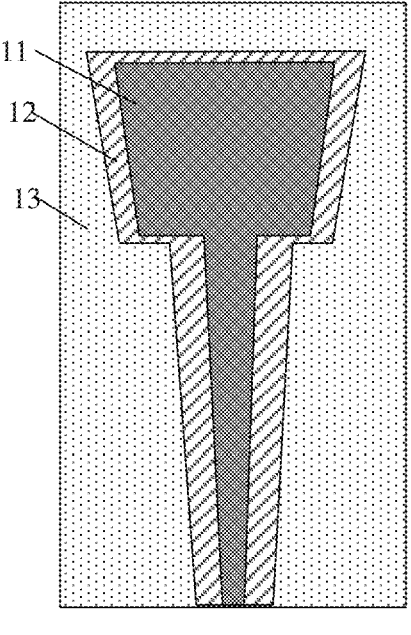
FIG. 9K is an eleventh schematic structural diagram of a capacitor structure in the manufacturing process provided by an embodiment of the disclosure.

Next, with reference to FIG. 9K, S810 is performed, in which a second electrode 13 of the capacitor structure is formed, the second electrode 13 covers at least part of an outer surface of the first dielectric layer 12, and the second electrode 13 is insulated from the first electrode 11.

In an embodiment, the first mask 61 has a first mask pattern 611, and the second mask 62 has a second mask pattern 621. The orthographic projection of the first mask pattern 611 on the substrate covers the orthographic projection of the second mask pattern 621 on the substrate; or, the orthographic projection of the second mask pattern 621 on the substrate covers the orthographic projection of the first mask pattern 611 on the substrate.

Specifically, for example, as shown in FIG. 9G, the orthographic projection of the second mask pattern 621 on the substrate covers the orthographic projection of the first mask pattern 611 on the substrate.

In an embodiment, the first mask to the Nth mask respectively have a first mask pattern to an Nth mask pattern, where N is greater than or equal to 3. The orthographic projection area of odd-numbered mask patterns on the substrate is smaller than the orthographic projection area of even-numbered mask patterns on the substrate; or, the orthographic projection area of the odd-numbered mask patterns on the substrate is larger than the orthographic projection area of the even-numbered mask patterns on the substrate.

In an embodiment, in the projection on a plane parallel to the substrate, a projection of the Nth mask pattern has equal areas at both sides of a projection of the first mask pattern.

Specifically, with reference to FIG. 9G, in the projection on a plane parallel to the substrate, the projection of the second mask pattern 621 has equal areas at both sides of the projection of the first mask pattern 611.

Figure 10:
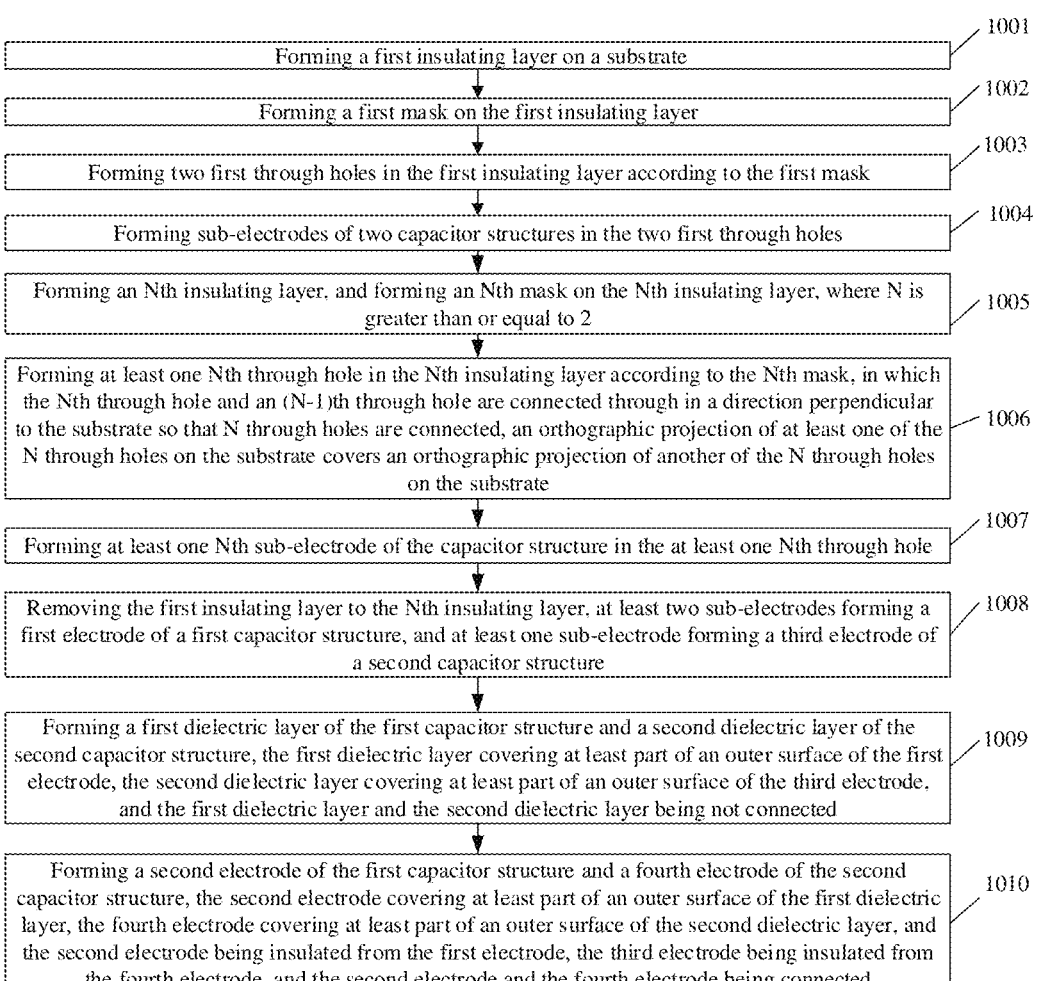
FIG. 10 is a flowchart of a method for manufacturing a semiconductor structure provided by an embodiment of the disclosure.

Embodiments of the disclosure further provide a method for manufacturing a semiconductor structure. In particular, with reference to FIG. 10, as shown in the figure, the method includes the following operations.

At S1001, a first insulating layer is formed on a substrate.

At S1002, a first mask is formed on the first insulating layer.

At S1003, two first through holes are formed in the first insulating layer according to the first mask.

At S1004, sub-electrodes of the two capacitor structures are respectively formed in the two first through holes.

At S1005, an Nth insulating layer is formed, and an Nth mask is formed on the Nth insulating layer, where N is greater than or equal to 2.

At S1006, at least one Nth through hole is formed in the Nth insulating layer according to the Nth mask, in which an Nth through hole and an (N−1)th through hole are connected through in a direction perpendicular to the substrate so that N through holes are connected, an orthographic projection of at least one of the N through holes on the substrate covers an orthographic projection of another of the N through holes on the substrate.

At S1007, at least one Nth sub-electrode of the capacitor structure is formed in the at least one Nth through hole.

At S1008, the first insulating layer to the Nth insulating layer are removed, at least two of the sub-electrodes form a first electrode of a first capacitor structure, and at least one of the sub-electrodes form a third electrode of a second capacitor structure.

At S1009, a first dielectric layer of the first capacitor structure and a second dielectric layer of the second capacitor structure are formed, in which the first dielectric layer covers at least part of an outer surface of the first electrode, the second dielectric layer covers at least part of an outer surface of the third electrode, the first dielectric layer and the second dielectric layer are not connected.

At S1010, a second electrode of the first capacitor structure and a fourth electrode of the second capacitor structure are formed, in which the second electrode covers at least part of an outer surface of the first dielectric layer, the fourth electrode covers at least part of an outer surface of the second dielectric layer, and the second electrode is insulated from the first electrode, the third electrode is insulated from the fourth electrode, and the second electrode and the fourth electrode are connected.

The method for manufacturing the semiconductor structure provided by the embodiments of the disclosure will be described in further detail below in combination with specific embodiments.

FIG. 11A to FIG. 11L are schematic structural diagrams of a semiconductor structure in the manufacturing process provided by an embodiment of the disclosure.

Figure 11A:
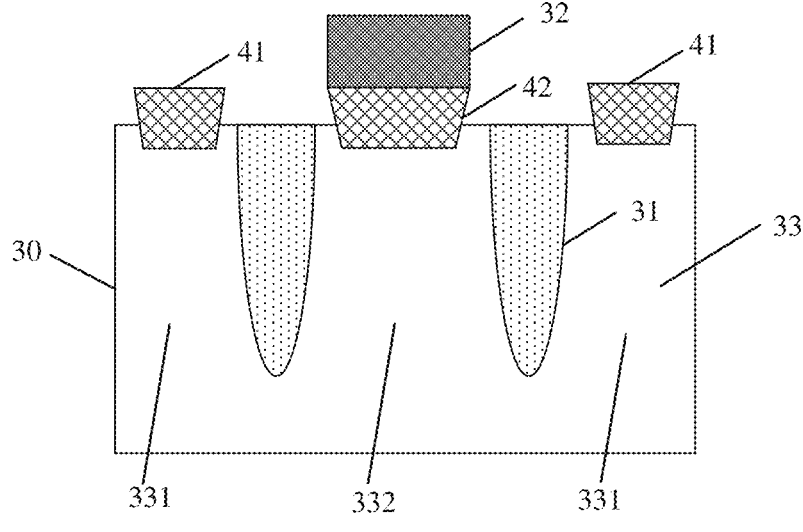
FIG. 11A is a first schematic structural diagram of a semiconductor structure in the manufacturing process provided by an embodiment of the disclosure.

FIG. 11A is a sectional view along the direction A-A' of FIG. 7. FIGS. 11B to 11L are schematic structural diagrams of a capacitor structure of the semiconductor structure in the manufacturing process provided by an embodiment of the disclosure.

First, with reference to FIG. 7 and FIG. 11A, before performing S1001, i.e. before forming a first insulating layer on the substrate, the method further includes the following operations.

A plurality of word lines 31 extending in a second direction are formed above the substrate 30 and a plurality of active areas that are discrete 33 are formed on the substrate 30.

Two first source/drain ends 331 are respectively formed on both sides of each active area 33 and a second source/drain end 332 is formed in the middle of each active area.

Second conductive plugs 42 are formed on the second source/drain ends 332.

Bit lines 32 are formed on the second conductive plugs 42, and the bit lines 32 extend in the first direction. The bit lines 32 are electrically connected with the second source/drain ends 332 of the active areas through the second conductive plugs 42.

Each of first conductive plugs 41 are respectively formed on the corresponding first source/drain end 331. The first conductive plugs 41 are located under the first capacitor structure and the second capacitor structure, and the first capacitor structure and the second capacitor structure are electrically connected with the two first source/drain ends 331 of a corresponding active area through the first conductive plugs 41.

The substrate 30 may be a silicon substrate, a germanium substrate, a silicon germanium substrate, a silicon carbide substrate, an SOI (Silicon On Insulator) substrate, a GOI (Germanium On Insulator) substrate, or the like. Also, it may be a substrate including other element semiconductor or compound semiconductor, such as a glass substrate or a Group III-V compound substrate (such as gallium nitride substrate or gallium arsenide substrate, or the like). Further, it may be a laminated structure, such as Si/SiGe, or the like, and may be another epitaxial structure, such as SGOI (Silicon Germanium On Insulator), or the like.

It should be explained that the formation order in the process of forming active areas and word lines in the substrate is not limited.

After the substrate 30 is provided, the method further includes forming an isolation structure 34 in the substrate 30, in which the isolation structure 34 defines the substrate 30 as the plurality of active areas that are discrete 33. The material of the isolation structure 34 may include at least one of an oxide (e.g. silicon oxide), a nitride (e.g. silicon nitride), or an oxynitride (e.g. silicon oxynitride).

The first source/drain ends 331 and the second source/drain end 332 may be formed within the active areas 33 by ion implantation. In a specific embodiment, the first source/drain ends 331 and the second source/drain ends 332 have the same conductivity type, such as n-type.

The materials of the word lines 31 and the bit lines 32 include tungsten (W), copper (Cu), titanium (Ti), tantalum (Ta), titanium nitride (TiN), tantalum nitride (TaN), a metal silicide, a metal alloy, or any combination thereof.

The materials of the first conductive plugs 41 and the second conductive plugs 42 are, for example, tungsten (W), copper (Cu), titanium (Ti), tantalum (Ta), titanium nitride (TiN), tantalum nitride (TaN), polysilicon, or a combination thereof.

Figure 11B:
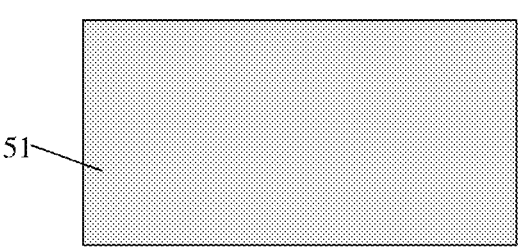
FIG. 11B is a second schematic structural diagram of a semiconductor structure in the manufacturing process provided by an embodiment of the disclosure.

Next, with reference to FIG. 11B, S1001 is performed, in which a first insulating layer 51 is formed on the substrate 30.

In practice, the first insulating layer 51 may be formed by one or more thin film deposition processes. Specifically, the deposition process includes, but is not limited to, chemical vapor deposition (CVD), plasma enhanced chemical vapor deposition (PECVD), atomic layer deposition (ALD), or a combination thereof.

Figure 11C:
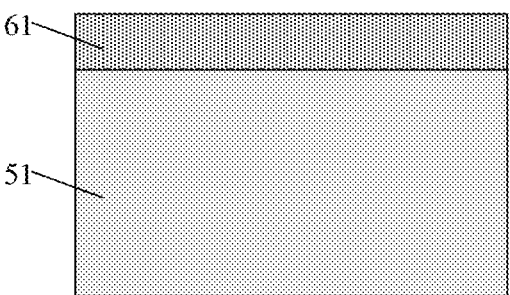
FIG. 11C is a third schematic structural diagram of a semiconductor structure in the manufacturing process provided by an embodiment of the disclosure.

Next, with reference to FIG. 11C, S1002 is performed, in which a first mask 61 is formed on the first insulating layer 51.

Figure 11D:
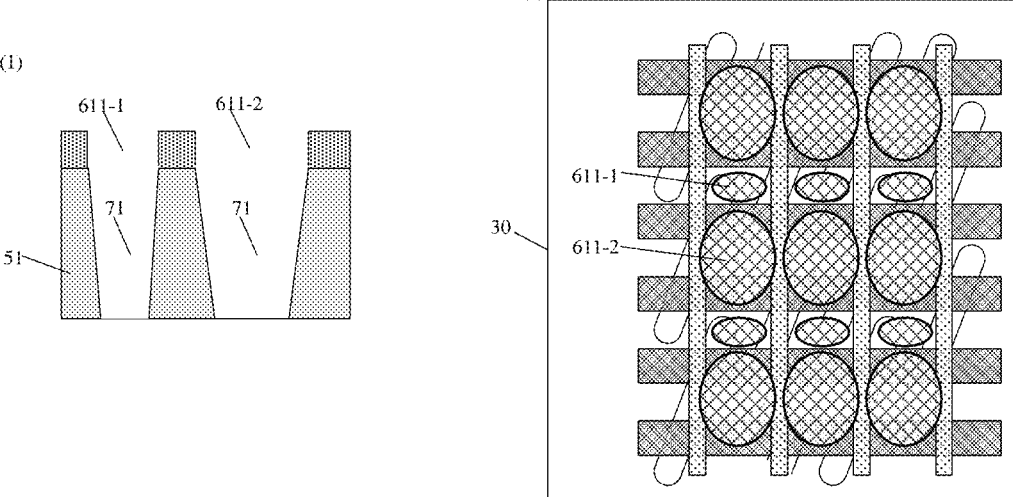
FIG. 11D is a fourth schematic structural diagram of a semiconductor structure in the manufacturing process provided by an embodiment of the disclosure.

Next, with reference to FIG. 11D, S1003 is performed, in which two first through holes 71 are formed in the first insulating layer 51 according to the first mask 61.

Specifically, the first mask 61 may be patterned to form a first pattern of the first mask 611-1 and a second pattern of the first mask 611-2. According to the first pattern of the first mask 611-1 and the second pattern of the first mask 611-2, the two first through holes 71 are formed in the first insulating layer 51. It should be explained that the orthographic projection area of the two first through holes on the substrate are not equal. Specifically, reference may be made to panel (2) of FIG. 11D.

Specifically, the first mask may be a photoresist mask or a hard mask patterned based on a photolithography mask; when the first mask is a photoresist mask, the first mask is patterned through the operations of exposure, development, glue removal, and the like. Next, first through holes with a certain depth are etched out according to the pattern to be etched.

Next, after the first through holes are formed, the remaining first mask is removed.

Figure 11E:
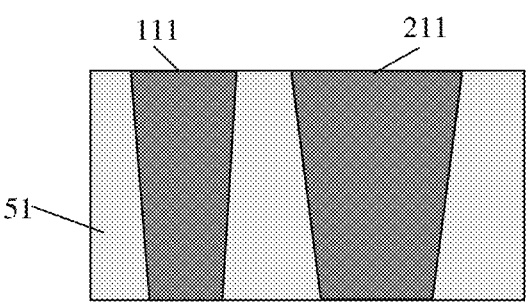
FIG. 11E is a fifth schematic structural diagram of a semiconductor structure in the manufacturing process provided by an embodiment of the disclosure.

Next, with reference to FIG. 11E, S1004 is performed, in which sub-electrodes of two capacitor structures are formed in the two first through holes.

Specifically, a first sub-electrode 111 of the first capacitor structure is formed in one of the first through holes, and a third sub-electrode 211 of the second capacitor structure is formed in the other of the first through holes.

Next, S1005 is performed, in which an Nth insulating layer is formed, and an Nth mask is formed on the Nth insulating layer, where N is greater than or equal to 2.

Figure 11F:
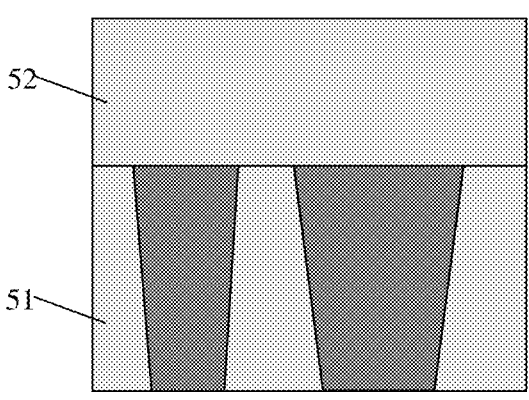
FIG. 11F is a sixth schematic structural diagram of a semiconductor structure in the manufacturing process provided by an embodiment of the disclosure.
Figure 11G:
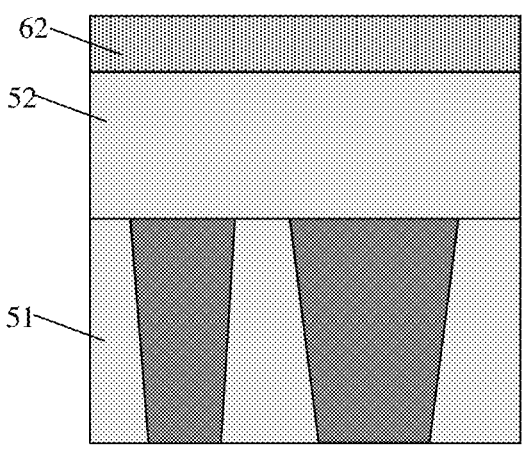
FIG. 11G is a seventh schematic structural diagram of a semiconductor structure in the manufacturing process provided by an embodiment of the disclosure.

Specifically, N equals 2 is taken as an example in this embodiment. With reference to FIG. 11F and FIG. 11G, a second insulating layer 52 is formed, and a second mask 62 is formed on the second insulating layer 52.

In practice, the second insulating layer 52 may be formed by one or more thin film deposition processes. Specifically, the deposition process includes, but is not limited to, chemical vapor deposition (CVD), plasma enhanced chemical vapor deposition (PECVD), atomic layer deposition (ALD), or a combination thereof.

Next, S1006 is performed, in which at least one Nth through hole is formed in the Nth insulating layer according to the Nth mask. The Nth through hole and the (N−1)th through hole are connected through in a direction perpendicular to the substrate so that N through holes are connected. The orthographic projection of at least one of the N through holes on the substrate covers the orthographic projection of another of the N through holes on the substrate.

Next, after the Nth through hole is formed, the remaining Nth mask is removed.

Figure 11H:
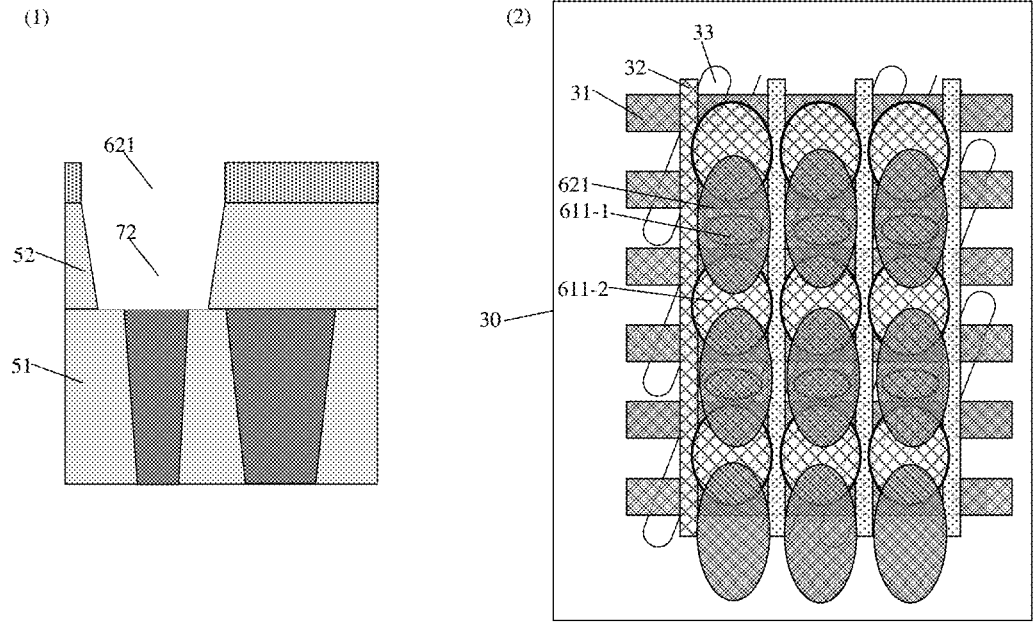
FIG. 11H is an eighth schematic structural diagram of a semiconductor structure in the manufacturing process provided by an embodiment of the disclosure.

Specifically, with reference to FIG. 11H, at least one second through hole 72 is formed in the second insulating layer 52 according to the second mask 62. The second through hole 72 and the first through hole 71 are connected through in the direction perpendicular to the substrate 30, the orthographic projection of the second through hole 72 on the substrate covers the orthographic projection of the first through hole 71 on the substrate 30.

Specifically, the second mask 62 may be patterned to form a second mask pattern 621. According to the second mask pattern 621, the second through hole 72 is formed in the second insulating layer 52.

Specifically, the second mask may be a photoresist mask or a hard mask patterned based on a photolithography mask; when the second mask is a photoresist mask, the first mask is patterned through the operations of exposure, development, glue removal, and the like. Next, a second through hole with a certain depth is etched out according to the pattern to be etched.

Next, S1007 is performed, in which at least one Nth sub-electrode of the capacitor structure is respectively formed in the at least one Nth through hole.

Figure 11I:
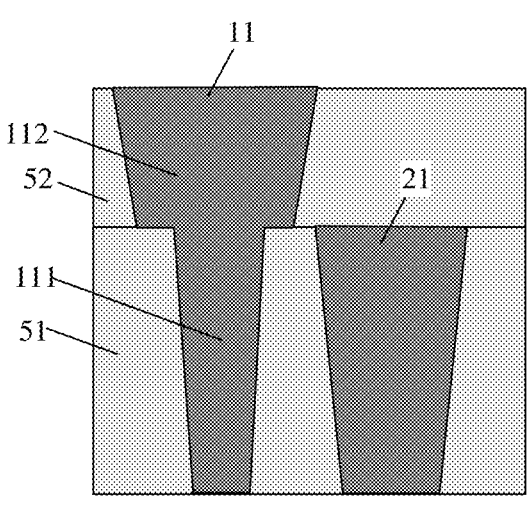
FIG. 11I is a ninth schematic structural diagram of a semiconductor structure in the manufacturing process provided by an embodiment of the disclosure.

Specifically, with reference to FIG. 11I, a second sub-electrode 112 of a first capacitor structure is formed in the second through hole 72.

Next, S1008 is performed, in which the first insulating layer to the Nth insulating layer are removed, at least two of the sub-electrodes form a first electrode of the first capacitor structure, and at least one of the sub-electrodes form a third electrode of a second capacitor structure.

Figure 11J:
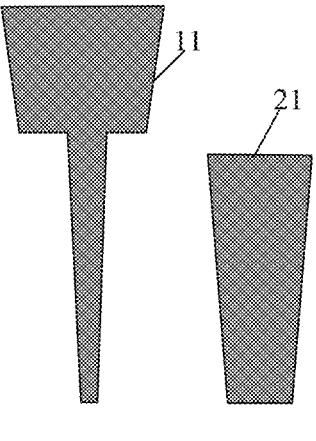
FIG. 11J is a tenth schematic structural diagram of a semiconductor structure in the manufacturing process provided by an embodiment of the disclosure.

Specifically, with reference to FIG. 11J, the first insulating layer 51 to the second insulating layer 52 are removed, two sub-electrodes form the first electrode 11 of the first capacitor structure, and one sub-electrode forms the third electrode 21 of the second capacitor structure.

Figure 11K:
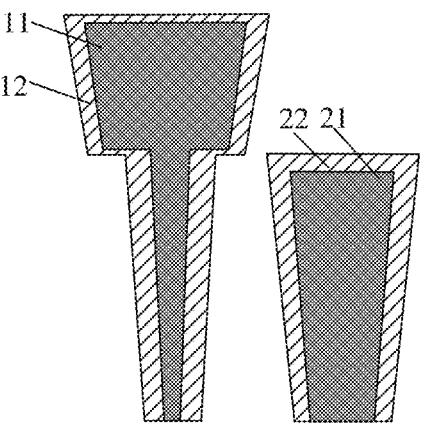
FIG. 11K is an eleventh schematic structural diagram of a semiconductor structure in the manufacturing process provided by an embodiment of the disclosure.

Next, with reference to FIG. 11K, S1009 is performed, in which a first dielectric layer 12 of the first capacitor structure 10 and a second dielectric layer 22 of the second capacitor structure 20 are formed, the first dielectric layer 12 covers at least part of an outer surface of the first electrode 11, the second dielectric layer 22 covers at least part of an outer surface of the third electrode 21, and the first dielectric layer 12 and the second dielectric layer 22 are not connected.

Figure 11L:
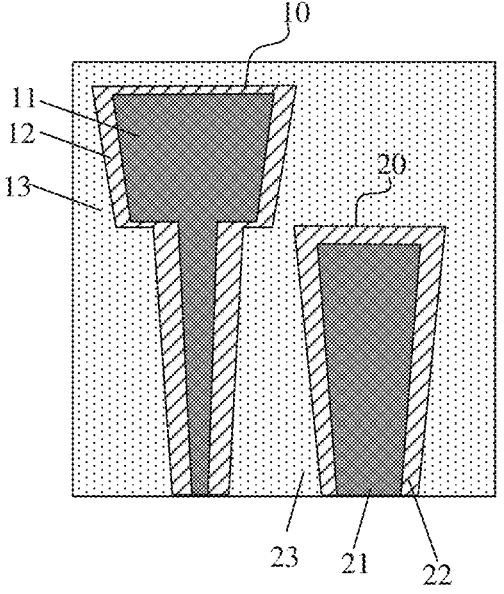
FIG. 11L is a twelfth schematic structural diagram of a semiconductor structure in the manufacturing process provided by an embodiment of the disclosure.

Next, with reference to FIG. 11L, S1010 is performed, in which a second electrode 13 of the first capacitor structure 10 and a fourth electrode 23 of the second capacitor structure 20 are formed. The second electrode 13 covers at least part of an outer surface of the first dielectric layer 12, the fourth electrode 23 covers at least part of an outer surface of the second dielectric layer 22, the second electrode 13 is insulated from the first electrode 11, the third electrode 21 is insulated from the fourth electrode 23, and the second electrode 13 and the fourth electrode 23 are connected.

In an embodiment, the materials of the first electrode 11, the second electrode 13, the third electrode 21 and the fourth electrode 23 include a metal. The materials of the first dielectric layer 12 and the second dielectric layer 22 include a high-K dielectric material.

Specifically, the materials of the first electrode 11 and the third electrode 21 include, but are not limited to, titanium nitride. The materials of the second electrode 13 and the fourth electrode 23 include, but are not limited to, polysilicon or germanium silicon.

The materials of the first dielectric layer 12 and the second dielectric layer 22 include a high-K dielectric material. In particular, the high-K dielectric material may include, but are not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_Y$), hafnium oxide ($HfO_2$), Hafnium silicon oxide ($HfSi_xO_Y$), hafnium silicon oxynitride (HfSiON), hafnium zirconate ($HfZrO_4$), lanthanum oxide ($La_2O_3$), lanthanum aluminium oxide ($LaAl_xO_Y$), lanthanum hafnium oxide ($LaHf_xO_Y$), hafnium aluminum oxide ($HfAl_xO_Y$), and/or praseodymium oxide ($Pr_2O_3$).

By using a high-K dielectric material as the materials of the first dielectric layer 12 and the second dielectric layer 22, the capacity of the capacitor structure can be improved.

In an embodiment, with reference to FIG. 11H, the first mask 61 has a first pattern of the first mask 611-1 and a second pattern of the first mask 611-2, and the second mask 62 has a second mask pattern 621. The orthographic projection of the second mask pattern 621 on the substrate 30 covers the orthographic projection of the first pattern of the first mask 611-1 on the substrate 30, and the orthographic projection area of the first pattern of the first mask 611-1 on the substrate 30 is smaller than the orthographic projection area of the second pattern of the first mask 611-2 on the substrate 30.

In an embodiment, the first mask has a first pattern of the first mask and a second pattern of the first mask the second mask has a first pattern of the second mask and a second pattern of the second mask. The orthographic projection of the first pattern of the second mask on the substrate covers the orthographic projection of the first pattern of the first mask on the substrate, the orthographic projection of the second pattern of the first mask on the substrate covers the orthographic projection of the second pattern of the second mask on the substrate, and the orthographic projection area of the first pattern of the first mask on the substrate is smaller than the orthographic projection area of the second pattern of the first mask on the substrate.

In an embodiment, the first mask has a first pattern of the first mask and a second pattern of the first mask, by parity of reasoning, the Nth mask has a first pattern of the Nth mask and a second pattern of the Nth mask, where N is greater than or equal to 3.

An orthographic projection area of first patterns of odd-numbered masks from the first mask to the Nth mask on the substrate is larger than an orthographic projection area of first patterns of even-numbered masks from the first mask to the Nth mask on the substrate, and an orthographic projection area of second patterns of the odd-numbered masks from the first mask to the Nth mask on the substrate is smaller than an orthographic projection area of second patterns of even-numbered masks from the first mask to the Nth mask on the substrate, the orthographic projection area of the first patterns of the odd-numbered masks from the first mask to the Nth mask on the substrate is larger than the orthographic projection area of the second patterns of the odd-numbered masks from the first mask to the Nth mask on the substrate, and the orthographic projection area of the first patterns of the even-numbered masks from the first mask to the Nth mask on the substrate is smaller than the orthographic projection area of second patterns of the even-numbered masks from the first mask to the Nth mask on the substrate; or, the orthographic projection area of the first patterns of the odd-numbered masks from the first mask to the Nth mask on the substrate is smaller than the orthographic projection area of the first patterns of the even-numbered masks from the first mask to the Nth mask on the substrate, the orthographic projection area of the second patterns of the odd-numbered masks from the first mask to the Nth mask on the substrate is larger than the orthographic projection area of the second patterns of the even-numbered masks from the first mask to the Nth mask on the substrate, the orthographic projection area of the first patterns of the odd-numbered masks from the first mask to the Nth mask on the substrate is smaller than the orthographic projection area of the second patterns of the odd-numbered masks from the first mask to the Nth mask on the substrate, and the orthographic projection area of the first patterns of the even-numbered masks from the first mask to the Nth mask on the substrate is larger than the orthographic projection area of the second patterns of the even-numbered masks from the first mask to the Nth mask on the substrate.

In an embodiment, the first pattern of the first mask 611-1, the second pattern of the first mask 611-2 and the second mask pattern 621 are elliptical in shape. The maximum width of the first pattern of the first mask 611-1 in the first direction is less than 0.5 times the width between two adjacent ones of the word lines 31, and the maximum width of the second pattern of the first mask 611-2 in the first direction is equal to the width between two adjacent ones of the word lines 31. The maximum width of the second mask pattern 621 in the first direction is equal to 1.5 times the width between two adjacent ones of the word lines 31. The first direction is the extension direction of the bit line 32. The maximum width of the first pattern of the first mask 611-1, the maximum width of the second pattern of the first mask 611-2, and the maximum width of the second mask pattern 621 in the second direction are equal to the width between two adjacent ones of the bit lines 32. The second direction is the extension direction of the word lines 31.

The description above is only preferred embodiments of the disclosure, and is not intended to limit the protection scope of the present disclosure. Any modification, equivalent replacement or improvement made within the spirit and principle of the disclosure falls within the protection scope of the disclosure.

The invention claimed is:

1. A semiconductor structure, comprising at least one first capacitor structure and a second capacitor structure; wherein the first capacitor structure comprises a substrate and a first electrode, a first dielectric layer and a second electrode that are arranged on the substrate, wherein the first dielectric layer is arranged on at least part of an outer surface of the first electrode; and wherein the second electrode is arranged on at least part of an outer surface of the first dielectric layer, and the second electrode is insulated from the first electrode; the second capacitor structure comprises the substrate and a third electrode, a second dielectric layer and a fourth electrode that are arranged on the substrate, the second dielectric layer is arranged on at least part of an outer surface of the third electrode, the fourth electrode is arranged on at least part of an outer surface of the second dielectric layer, and the fourth electrode is insulated from the third electrode; and wherein the first dielectric layer of the first capacitor structure and the second dielectric layer of the second capacitor structure that are adjacent are not connected, and the second electrode of the first capacitor structure and the fourth electrode of the second capacitor structure that are adjacent are connected;

wherein the first electrode comprises N sub-electrodes continuously arranged in the direction perpendicular to the substrate and connected in sequence; and N is greater than or equal to 3;

wherein the third electrode comprises M sub-electrodes continuously arranged in the direction perpendicular to the substrate and connected in sequence; and M is greater than or equal to 2, and M is less than or equal to N; and wherein an orthographic projection area of odd-numbered sub-electrodes of the first electrode on the substrate is larger than an orthographic projection area of even-numbered sub-electrodes of the first electrode on the substrate, an orthographic projection area of odd-numbered sub-electrodes of the third electrode on the substrate is smaller than an orthographic projection area of even-numbered sub-electrodes of the third electrode on the substrate, the orthographic projection area of the odd-numbered sub-electrodes of the first electrode on the substrate is larger than the orthographic projection area of the odd-numbered sub-electrodes of the third electrode on the substrate, and the orthographic projection area of the even-numbered sub-electrodes of the first electrode on the substrate is smaller than the orthographic projection area of the even-numbered sub-electrodes of the third electrode on the substrate; or, the orthographic projection area of the odd-numbered sub-electrodes of the first electrode on the substrate is smaller than the orthographic projection area of the even-numbered sub-electrodes of the first electrode on the substrate, the orthographic projection area of the odd-numbered sub-electrodes of the third electrode on the substrate is larger than the orthographic projection area of the even-numbered sub-electrodes of the third electrode on the substrate, the orthographic projection area of the odd-numbered sub-electrodes of the first electrode on the substrate is smaller than the orthographic projection area of the odd-numbered sub-electrodes of the third electrode on the substrate, and the orthographic projection area of the even-numbered sub-electrodes of the first electrode on the substrate is larger than the orthographic projection area of the even-numbered sub-electrodes of the third electrode on the substrate.

2. The semiconductor structure according to claim 1, wherein the first electrode comprises a first sub-electrode and a second sub-electrode continuously arranged in the direction perpendicular to the substrate and connected in sequence; and the first sub-electrode is closer to the substrate compared to the second sub-electrode; and wherein an orthographic projection of the second sub-electrode on the substrate covers an orthographic projection of the first sub-electrode on the substrate, and an orthographic projection area of the first sub-electrode on the substrate is smaller than an orthographic projection area of the third electrode on the substrate.

3. The semiconductor structure according to claim 1, wherein the first electrode comprises a first sub-electrode and a second sub-electrode continuously arranged in the direction perpendicular to the substrate and connected in sequence; and the first sub-electrode is closer to the substrate compared to the second sub-electrode; wherein the third electrode comprises a third sub-electrode and a fourth sub-electrode continuously arranged in the direction perpendicular to the substrate and connected in sequence; and the third sub-electrode is closer to the substrate compared to the fourth sub-electrode; and wherein an orthographic projection of the second sub-electrode on the substrate covers an orthographic projection of the first sub-electrode on the substrate, an orthographic projection of the third sub-electrode on the substrate covers an orthographic projection of the fourth sub-electrode on the substrate, and an orthographic projection area of the first sub-electrode on the substrate is smaller than an orthographic projection area of the third sub-electrode on the substrate; or, the orthographic projection of the first sub-electrode on the substrate covers the orthographic projection of the second sub-electrode on the substrate, the orthographic projection of the fourth sub-electrode on the substrate covers the orthographic projection of the third sub-electrode on the substrate, and the orthographic projection area of the first sub-electrode on the substrate is larger than the orthographic projection area of the third sub-electrode on the substrate.

4. The semiconductor structure according to claim 1, wherein the substrate comprises a plurality of word lines extending in a second direction and a plurality of active areas; the plurality of active areas are discrete; and each of the active areas comprises two first source/drain ends respectively located on both sides and a second source/drain end located in a middle; and wherein the semiconductor structure further comprises:

a plurality of bit lines located on the substrate extending along a first direction;

a plurality of first conductive plugs located below the first capacitor structure and the second capacitor structure; wherein the first capacitor structure and the second capacitor structure are electrically connected with the two first source/drain ends of each of the active areas through the first conductive plugs; and a plurality of second conductive plugs located below the bit lines; wherein the bit lines are electrically connected with the second source/drain ends of the active areas through the second conductive plugs.

5. The semiconductor structure according to claim 1,
wherein materials of the first electrode, the second electrode, the third electrode and the fourth electrode comprise a metal; and
wherein materials of the first dielectric layer and the second dielectric layer comprises a high-K dielectric material.

6. A method for manufacturing the semiconductor structure of claim 5, comprising:
forming a first insulating layer on the substrate;
forming a first mask on the first insulating layer;
forming two first through holes in the first insulating layer according to the first mask;
forming sub-electrodes of two capacitor structures in the two first through holes;
forming an Nth insulating layer, and forming an Nth mask on the Nth insulating layer;
forming at least one Nth through hole in the Nth insulating layer according to the Nth mask, wherein the Nth through hole and an (N–1)th through hole are connected through in a direction perpendicular to the substrate so that N through holes are connected, and an orthographic projection of at least one of the N through holes on the substrate covers an orthographic projection of another of the N through holes on the substrate;
forming at least one Nth sub-electrode of the capacitor structure in the at least one Nth through hole;
removing the first insulating layer to the Nth insulating layer, at least two sub-electrodes forming the first electrode of the first capacitor structure, and at least one sub-electrode forming the third electrode of the second capacitor structure;
forming the first dielectric layer of the first capacitor structure and the second dielectric layer of the second capacitor structure, the first dielectric layer covering at least part of the outer surface of the first electrode, the second dielectric layer covering at least part of the outer surface of the third electrode, and the first dielectric layer and the second dielectric layer being not connected; and
forming the second electrode of the first capacitor structure and the fourth electrode of the second capacitor structure, the second electrode covering at least part of the outer surface of the first dielectric layer, the fourth electrode covering at least part of the outer surface of the second dielectric layer, the second electrode being insulated from the first electrode, the third electrode being insulated from the fourth electrode, and the second electrode and the fourth electrode being connected.

7. The method according to claim 6,
wherein the first mask has a first pattern of the first mask and a second pattern of the first mask, the second mask has a second mask pattern, an orthographic projection of the second mask pattern on the substrate covers an orthographic projection of the first pattern of the first mask on the substrate, and an orthographic projection area of the first pattern of the first mask on the substrate is smaller than an orthographic projection area of the second pattern of the first mask on the substrate.

8. The method according to claim 6,
wherein the first mask has a first pattern of the first mask and a second pattern of the first mask, the second mask has a first pattern of the second mask and a second pattern of the second mask; and
wherein an orthographic projection of the first pattern of the second mask on the substrate covers an orthographic projection of the first pattern of the first mask on the substrate, an orthographic projection of the second pattern of the first mask on the substrate covers an orthographic projection of the second pattern of the second mask on the substrate, an orthographic projection area of the first pattern of the first mask on the substrate is smaller than an orthographic projection area of the second pattern of the first mask on the substrate.

9. The method according to claim 6,
wherein the first mask has a first pattern of the first mask and a second pattern of the first mask, by parity of reasoning, the Nth mask has a first pattern of the Nth mask and a second pattern of the Nth mask; and
wherein an orthographic projection area of first patterns of odd-numbered masks from the first mask to the Nth mask on the substrate is larger than an orthographic projection area of first patterns of even-numbered masks from the first mask to the Nth mask on the substrate, and an orthographic projection area of second patterns of the odd-numbered masks from the first mask to the Nth mask on the substrate is smaller than an orthographic projection area of second patterns of even-numbered masks from the first mask to the Nth mask on the substrate, the orthographic projection area of the first patterns of the odd-numbered masks from the first mask to the Nth mask on the substrate is larger than the orthographic projection area of the second patterns of the odd-numbered masks from the first mask to the Nth mask on the substrate, and the orthographic projection area of the first patterns of the even-numbered masks from the first mask to the Nth mask on the substrate is smaller than the orthographic projection area of second patterns of the even-numbered masks from the first mask to the Nth mask on the substrate; or,
the orthographic projection area of the first patterns of the odd-numbered masks from the first mask to the Nth mask on the substrate is smaller than the orthographic projection area of the first patterns of the even-numbered masks from the first mask to the Nth mask on the substrate, the orthographic projection area of the second patterns of the odd-numbered masks from the first mask to the Nth mask on the substrate is larger than the orthographic projection area of the second patterns of the even-numbered masks from the first mask to the Nth mask on the substrate, the orthographic projection area of the first patterns of the odd-numbered masks from the first mask to the Nth mask on the substrate is smaller than the orthographic projection area of the second patterns of the odd-numbered masks from the first mask to the Nth mask on the substrate, and the orthographic projection area of the first patterns of the even-numbered masks from the first mask to the Nth mask on the substrate is larger than the orthographic projection area of the second patterns of the even-numbered masks from the first mask to the Nth mask on the substrate.

10. The method according to claim 7,
wherein shapes of the first pattern of the first mask, the second pattern of the first mask and the second mask pattern are elliptical;
wherein a maximum width of the first pattern of the first mask in a first direction is less than 0.5 times of a width between two adjacent ones of word lines, a maximum width of the second pattern of the first mask in the first direction is equal to a width between two adjacent ones of the word lines, a maximum width of the second mask pattern in the first direction is equal to 1.5 times of the width between two adjacent ones of the word lines, and the first direction is an extension direction of bit lines; and wherein a maximum width of the first pattern of the first mask, a maximum width of the second pattern of the first mask and a maximum width of the second mask pattern in a second direction is equal to a width between two adjacent ones of the bit lines, and the second direction is an extension direction the word lines.

11. The method according to claim 6, further comprising:
before forming the first insulating layer, forming a plurality of word lines extending in a second direction and a plurality of active areas on the substrate, the plurality of active areas being discrete;

forming two first source/drain ends on both sides of each of the active areas respectively and forming a second source/drain end in a middle of each of the active areas;

forming second conductive plugs on second source/drain ends;

forming bit lines on the second conductive plugs, the bit lines extending in a first direction; wherein the bit lines are electrically connected with the second source/drain ends of the active areas through the second conductive plugs; and forming first conductive plugs on first source/drain ends; wherein the first conductive plugs are located under the first capacitor structure and the second capacitor structure, and the first capacitor structure and the second capacitor structure are electrically connected with the two first source/drain ends of a corresponding active area through the first conductive plugs.

* * * * *